(12) United States Patent
Shafer et al.

(10) Patent No.: US 7,180,658 B2
(45) Date of Patent: Feb. 20, 2007

(54) HIGH PERFORMANCE CATADIOPTRIC IMAGING SYSTEM

(75) Inventors: David R. Shafer, Fairfield, CT (US); Yung-Ho Chuang, Cupertino, CA (US); J. Joseph Armstrong, Milpitas, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/434,374

(22) Filed: May 7, 2003

(65) Prior Publication Data

US 2004/0165257 A1    Aug. 26, 2004

Related U.S. Application Data

(60) Provisional application No. 60/449,326, filed on Feb. 21, 2003.

(51) Int. Cl.
*G02B 17/08*    (2006.01)

(52) U.S. Cl. .................. 359/364; 359/351; 359/355; 359/727

(58) Field of Classification Search ........ 359/364–366, 359/368, 351, 355–357, 729–731, 858–859
See application file for complete search history.

(56) References Cited

U.S. PATENT DOCUMENTS

| | | | |
|---|---|---|---|
| 1,973,066 A | 9/1934 | Hauser et al. |
| 2,661,658 A | 12/1953 | Dyson |
| 3,237,515 A | 3/1966 | Altman |
| 4,758,088 A | 7/1988 | Doyle |
| 4,779,966 A | 10/1988 | Friedman |
| 4,795,244 A | 1/1989 | Uehara et al. |
| 4,898,471 A | 2/1990 | Stonestrom et al. |

(Continued)

FOREIGN PATENT DOCUMENTS

DE    108181    1/1900

(Continued)

OTHER PUBLICATIONS

M.R. Bartz et al., "LED Print Analyser," IBM Technical Disclosure Bulletin, vol. 14, No. 3, Aug. 1971.

(Continued)

*Primary Examiner*—Mark A. Robinson
*Assistant Examiner*—Lee Fineman
(74) *Attorney, Agent, or Firm*—Smyrski Law Group, A P.C.

(57) ABSTRACT

A reduced size catadioptric objective and system is disclosed. The objective may be employed with light energy having a wavelength in the range of approximately 190 nanometers through the infrared light range. Elements are less than 100 mm in diameter. The objective comprises a focusing lens group configured to receive the light energy and comprising at least one focusing lens. The objective further comprises at least one field lens oriented to receive focused light energy from the focusing lens group and provide intermediate light energy. The objective also includes a Mangin mirror arrangement positioned to receive the intermediate light energy from the field lens and form controlled light energy for transmission to a specimen. The Mangin mirror arrangement imparts controlled light energy with a numerical aperture in excess of 0.65 and up to approximately 0.90, and the design may be employed in various environments.

73 Claims, 17 Drawing Sheets

U.S. PATENT DOCUMENTS

| | | | |
|---|---|---|---|
| 4,971,428 A | 11/1990 | Moskovich | |
| 4,974,094 A | 11/1990 | Morito | |
| 5,031,976 A | 7/1991 | Shafer | |
| 5,052,763 A | 10/1991 | Singh et al. | |
| 5,089,913 A | 2/1992 | Singh et al. | |
| 5,114,238 A | 5/1992 | Sigler | |
| 5,140,459 A | 8/1992 | Sagan | |
| 5,177,559 A | 1/1993 | Batchelder et al. | |
| 5,323,263 A | 6/1994 | Schoenmakers | |
| 5,428,442 A | 6/1995 | Lin et al. | |
| 5,488,229 A | 1/1996 | Elliott et al. | |
| 5,515,207 A | 5/1996 | Foo | |
| 5,636,066 A | 6/1997 | Takahashi | |
| 5,644,140 A | 7/1997 | Biedermann et al. | |
| 5,668,673 A | 9/1997 | Suenaga et al. | |
| 5,717,518 A | 2/1998 | Shafer et al. | |
| 5,805,334 A | 9/1998 | Takahashi | |
| 5,805,356 A | 9/1998 | Chiba | |
| 5,805,357 A | 9/1998 | Omura | |
| 5,808,805 A | 9/1998 | Takahashi | |
| 5,835,275 A | 11/1998 | Takahashi et al. | |
| 5,861,997 A | 1/1999 | Takahashi | |
| 5,880,891 A | 3/1999 | Furter | |
| 5,999,310 A | 12/1999 | Shafer et al. | |
| 6,064,517 A * | 5/2000 | Chuang et al. | 359/364 |
| 6,169,627 B1 | 1/2001 | Schuster | |
| 6,377,338 B1 | 4/2002 | Suenaga | |
| 6,512,631 B2 | 1/2003 | Shafer et al. | |
| 6,560,039 B1 | 5/2003 | Webb et al. | |
| 6,600,608 B1 | 7/2003 | Shafer et al. | |
| 2001/0040722 A1 * | 11/2001 | Shafer et al. | 359/351 |
| 2004/0095573 A1 * | 5/2004 | Tsai et al. | 356/237.5 |

FOREIGN PATENT DOCUMENTS

| | | |
|---|---|---|
| DE | 3742806 | 7/1989 |
| EP | 0798585 | 10/1997 |
| EP | 1061358 | 12/2000 |
| EP | 1093017 | 4/2001 |
| EP | 1098215 | 5/2001 |
| GB | 2269024 | 1/1994 |
| WO | 9712226 | 4/1997 |
| WO | 9908134 | 2/1999 |
| WO | 0002037 | 1/2000 |
| WO | 0077500 | 12/2000 |

OTHER PUBLICATIONS

J.L.C. Sanz et al., "Automated Visual Inspection with Dark-Field Microscopy," Journal of the Optical Society of America, Nov. 1985, USA, vol. 2, No. 11, pp. 1857-1862.

Smith, "Modern Optical Engineering: The Design of Optical Systems," 3rd Ed., McGraw-Hill, 2000, p. 487.

D.S. Goodman, "Darkfield Illuminator Attachment," IBM Technical Disclosure Bulletin, vol. 27, No. 5, Oct. 1984.

* cited by examiner

HIGH PERFORMANCE CATADIOPTRIC IMAGING SYSTEM

This application claims the benefit of U.S. Provisional Patent Application Ser. No. 60/449,326, entitled "High Performance, Low Cost Catadioptric Imaging System," filed Feb. 21, 2003.

BACKGROUND OF THE INVENTION

1. Field of the Invention

The present invention relates generally to the field of optical imaging and more particularly to catadioptric optical systems used for microscopic imaging, inspection, and lithography applications.

2. Description of the Related Art

Many optical and electronic systems exist to inspect surface features for defects such as those on a partially fabricated integrated circuit or a photomask. Defects may take the form of particles randomly localized on the surface, scratches, process variations, and so forth. Such techniques and devices are well known in the art and are embodied in various commercial products such as those available from KLA-Tencor Corporation of San Jose, Calif.

Specialized optical systems are required in inspection devices to enable imaging of defects found on semiconductor wafers and photomasks. Improved performance for such systems may be realized using specially designed components that facilitate beneficial inspection parameters, such as high numerical apertures. The numerical aperture of an objective represents the objective's ability to collect light and resolve fine specimen detail at a fixed object distance. Numerical aperture is measured as the sine of the vertex angle of the largest cone of meridional rays that can enter or leave the optical system or element, multiplied by the refractive index of the medium in which the vertex of the cone is located. A large numerical aperture provides distinct advantages during inspection, not the least of which is an ability to resolve smaller features of the specimen. Also, high NAs collect a larger scattering angle, thereby tending to improve performance in darkfield environments over systems having relatively low NAs. Two patents that disclose high numerical aperture (NA) catadioptric systems are U.S. Pat. No. 5,717,518 to Shafer et al. and U.S. Pat. No. 6,483,638 to Shafer et al. A representative illustration of a catadioptric design 100 in accordance with the teachings of the '518 patent is presented in FIG. 1, which is similar to FIG. 1 of the '518 patent. A representative illustration of a catadioptric design 200 in accordance with the teachings of the '638 patent is presented in FIG. 2, which has similarities to FIG. 4 of the '638 patent.

U.S. Pat. No. 5,717,518 to Shafer et al. discloses an imaging design capable of high NA, ultra broadband UV imaging. The high NA (up to approximately 0.9) system can be used for broadband bright field and multiple wavelength dark-field imaging. Certain issues exist with designs similar to that presented in FIG. 1. First, the field lens group may need to be physically located within a central hole in the large curved catadioptric element, which can make manufacturing very difficult and extremely expensive. Second, the field lens elements in such a design may require at least one glued interface. In the presence of wavelengths less then 365 nm, reliable glues that can withstand light intensity levels at an internal focus are generally unavailable. Third, the lens elements in such a design may be located very close to a field plane, thereby requiring a high degree of, or nearly perfect, surface quality and bulk material quality to prevent image degradation. Fourth, element diameters are typically larger than a standard microscope objective, especially for the catadioptric group. Large diameter elements frequently make integration into an inspection system difficult and can increase manufacturing costs.

The design of FIG. 2 is generally capable of high NA, ultra broadband UV imaging. The design is a high NA (up to approximately 0.9) imaging system that can be used for broadband bright field and multiple wavelength dark-field imaging and can use a varifocal tube lens to provide a large range of magnifications. The FIG. 2 design introduces very tight tolerances in the field lens group, due in part to increased on-axis spherical aberration produced by the catadioptric group. This on-axis spherical aberration must be corrected by the following refractive lens elements. The design of FIG. 2 is relatively large, thereby generally requiring complicated optomechanical mounting of elements, especially in the catadioptric group.

Other optical arrangements have been developed to perform specimen inspection, but each arrangement tends to have certain specific drawbacks and limitations. Generally, in a high precision inspection environment, an objective with a short central wavelength provides advantages over those with long central wavelengths. Shorter wavelengths can enable higher optical resolution and improved defect detection, and can facilitate improved defect isolation on upper layers of multi-layer specimens, such as semiconductor wafers. Shorter wavelengths can provide improved defect characterization. An objective that can cover as large a wavelength range as possible may also be desirable, particularly when using an arc lamp as an illumination source. An all refractive objective design is difficult in this wavelength range because few glass materials having high transmission are effective for chromatic correction. A small bandwidth may not be desirable for inspection applications due to limitation of available light power and increased interference from thin films on the surface being inspected.

A large field size can provide distinct advantages during inspection. One advantage is an ability to scan a larger area of the specimen in a given period of time, thereby increasing throughput, measured as the ability to scan a large area over a small period of time. A relatively large field size in a typical design in this type of environment can be approximately or greater than 0.2 mm using an imaging magnification of 200× to support a sensor with an 40 mm diagonal. Small objectives are also desirable, as small objectives can be used in combination with standard microscope objectives and fit in standard microscope turrets. The standard objective flange to object length is 45 mm, while certain objectives employ lens diameters greater than 100 mm having length of over 100 mm. Other smaller catadioptric objectives have been produced, but still typically have lens diameters in excess of 60 mm and length over 60 mm. Certain of these smaller objectives have NAs limited to 0.75 and field sizes limited to 0.12 mm with a bandwidth less than 10 nm. Such designs typically use a Schwartzchild approach with lenses added within the catadioptric group in an effort to improve performance. Working distances are typically greater than 8 mm. This design approach can somewhat reduce the objective diameter, at the cost of increasing central obscuration, significantly degrading objective performance.

An objective having low intrinsic aberrations is also desirable, as is an objective that is largely self-corrected for both monochromatic and chromatic aberrations. A self corrected objective will have looser alignment tolerances with other self corrected imaging optics. An objective with loose manufacturing tolerances, such as lens centering tolerances, may be particularly beneficial. Further, reducing incidence angles on lens surfaces can have a large effect on optical coating performance and manufacturing. In general, lower angles of incidence on lens surfaces also produce looser manufacturing tolerances.

It would be beneficial to provide a system overcoming these drawbacks present in previously known systems and provide an optical inspection system design having improved functionality over devices exhibiting those negative aspects described herein.

SUMMARY OF THE INVENTION

According to an aspect of the present design, there is provided an objective comprising a focusing lens group comprising at least one focusing lens configured to receive the light energy, a field lens oriented to receive focused light energy from the focusing lens group and provide intermediate light energy, and a Mangin mirror arrangement positioned to receive the intermediate light energy from the field lens and form controlled light energy. The largest of the focusing lens group, field lens, and Mangin mirror are less than 100 millimeters in diameter, and the objective may be corrected for relative bandwidths up to approximately 0.16.

These and other objects and advantages of the present invention will become apparent to those skilled in the art from the following detailed description of the invention and the accompanying drawings.

DETAILED DESCRIPTION OF THE INVENTION

Figure 3:
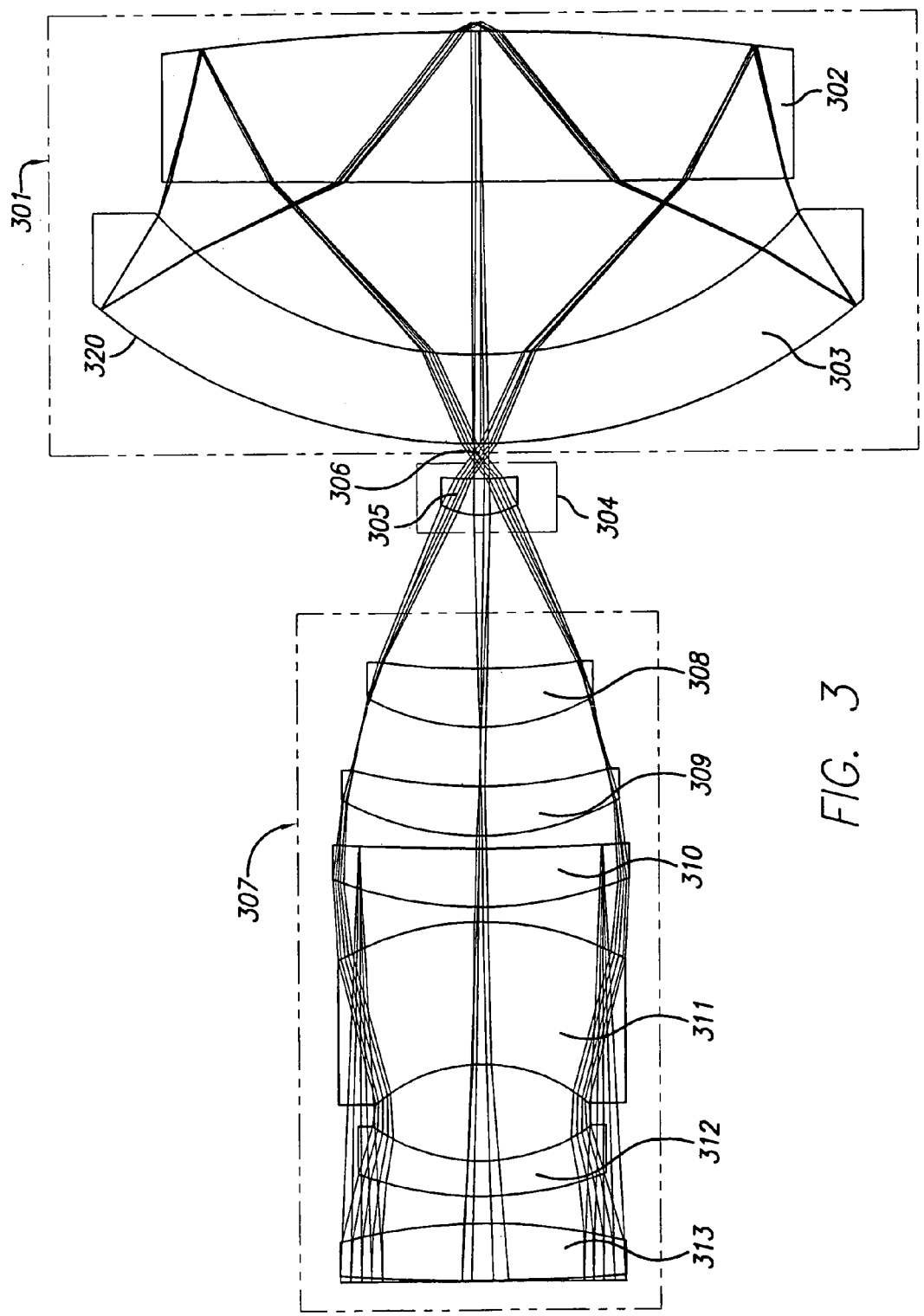
FIG. 3 presents a reduced size catadioptric objective with a high NA in accordance with the present invention.

According to the present invention, there is provided a catadioptric objective corrected over a wavelength range from 285–320 nm using a single glass material, or in certain circumstances, more than one glass material to improve performance. One aspect of the objective design is shown in FIG. 3. The catadioptric objective as shown in FIG. 3 is optimized for broad-band imaging in the UV spectral region, namely approximately 0.285 to 0.320 micron wavelengths. The objective provides relatively high numerical apertures and large object fields. The inventive design presented uses the Schupmann principle in combination with an Offner field lens to correct for axial color and first order lateral color. As shown in the aspect presented in FIG. 3, the field lens group 305 is slightly displaced from the intermediate image 306 to obtain enhanced performance.

From FIG. 3, the catadioptric group 301 or Mangin mirror arrangement includes a Mangin mirror element 302. Mangin mirror element 302 is a reflectively coated lens element. The catadioptric group 301 also includes and a concave spherical reflector 303, also a reflectively coated lens element. Both elements in the catadioptric group 301 have central optical apertures where reflective material is absent. This allows light to pass from the object or specimen 300 (not shown) through Mangin mirror element 302, reflect from the second or inner surface of concave spherical reflector 303, onto the reflective surface 320 of Mangin mirror element 302, and through concave spherical reflector 303 to form an intermediate image 306 between concave spherical reflector 303 and field lens group 304. The field lens group 304 may comprise one or more lenses, and in the aspect shown in FIG. 3, one field lens is employed in the field lens group 304.

The focusing lens group 307 uses multiple lens elements, in the aspect shown six lens elements 308, 309, 310, 311, 312, and 313. All lenses in the focusing lens group 307 may be formed from a single type of material to collect the light from the field lens group 304 and the intermediate image 306.

The lens prescription for the aspect of the invention illustrated in FIG. 3 is presented in Table 1.

TABLE 1

Prescription for lenses for the design of FIG. 3

| Surface Number | Radius | Thickness | Glass | Diameter |
|---|---|---|---|---|
| OBJ | Infinity | Infinity | | 0 |
| 1 | Infinity | 15.50165 | | 9.39467 |
| STO | Infinity | −15.50165 | | 8 |
| 3 | 53.51878 | 2 | Fused Silica | 9.376161 |
| 4 | −18.17343 | 0.976177 | | 9.234857 |
| 5 | 10.48757 | 1.249953 | Fused Silica | 8.151456 |
| 6 | 5.891816 | 3.328088 | | 7.199539 |
| 7 | −5.254784 | 5.105439 | Fused Silica | 7.084075 |
| 8 | −8.860388 | 0.5 | | 9.430437 |
| 9 | 12.82516 | 2 | Fused Silica | 9.711337 |
| 10 | 61.04848 | 0.5 | | 9.468601 |
| 11 | 8.892555 | 1.75 | Fused Silica | 9.125279 |
| 12 | 15.75614 | 2.126452 | | 8.563035 |
| 13 | 7.216376 | 2 | Fused Silica | 7.4431 |
| 14 | 21.90145 | 5.382485 | | 6.702302 |
| 15 | 2.321495 | 1.3 | Fused Silica | 2.530266 |
| 16 | 13.47255 | 0.669203 | | 1.651874 |
| 17 | Infinity | 0.498865 | | 0.711891 |
| 18 | 17.99728 | 3.170995 | Fused Silica | 25 |
| 19 | 13.41607 | 6.08537 | | 21 |
| 20 | 972.9414 | 5.220004 | Fused Silica | 20.5 |
| 21 | −78 | −5.220004 | MIRROR | 20.5 |
| 22 | 972.9414 | −6.08537 | | 20.5 |
| 23 | 13.41607 | −3.170995 | Fused Silica | 21 |
| 24 | 17.99728 | 3.170995 | MIRROR | 25 |
| 25 | 13.41607 | 6.08537 | | 21 |
| 26 | 972.9414 | 5.220004 | Fused Silica | 20.5 |
| 27 | −78 | 0.3 | | 20.5 |
| IMA | Infinity | | | 0.410191 |

As may be appreciated by one skilled in the art, the numbers in the leftmost column of Table 1 represent the surface number counting surfaces from the left of FIG. 3. For example, the left surface of lens 308 in the orientation presented in FIG. 3 (surface 3 in Table 1) has a radius of curvature of 53.51878 mm, a thickness of 2 mm, and the rightmost surface (surface 4) has a radius of curvature of −18.17343 mm, and is 0.976177 mm from the next surface. The material used is fused silica, and the diameter of the left surface is 9.376161 mm and of the right surface is 9.234857 mm.

In the design presented in FIG. 3, the numerical aperture may approach or even exceed approximately 0.90. The design presented herein, including the aspect illustrated in FIG. 3, provides a maximum numerical aperture in all cases in excess of 0.65.

From FIG. 3, the focusing lens group 307 has the ability to receive light energy and transmit focused light energy. The field lens group 304 has the ability to receive the focused light energy and provide intermediate light energy, and form intermediate image 306. The catadioptric group or Mangin mirror arrangement 301 receives the intermediate energy and provides controlled light energy to the specimen. Alternately, the reflected path originates at the specimen, and light reflected from the specimen is received by the catadioptric group or Mangin mirror arrangement 301 and forms and transmits reflected light energy. The field lens group 304 receives the reflected light energy and transmitting resultant light energy, and the focusing lens group receives resultant light energy and transmits focused resultant light energy.

The design presented in FIG. 3 and Table 1 thus uses a single glass material, fused silica. Other materials may be employed, but it is noted that fused silica or any material used within the design may require low absorption over a wide range of wavelengths from 190 nm through the infrared wavelength. Use of fused silica can enable the design to be re-optimized for any center wavelength in this wavelength range. For example, the design can be optimized for use with lasers at 193, 198.5, 213, 244, 248, 257, 266, 308, 325, 351, 355, or 364 nm. The design can also be optimally employed to cover lamp spectral bands from 192–194, 210–216, 230–254, 285–320, and 365–546 nm. In addition, if calcium fluoride is employed as the glass or lens material, the design can be employed with an excimer laser at 157 nm or excimer lamps at 157 or 177 nm. Re-optimization requires tuning or altering components within the abilities of those skilled in the art. Calcium fluoride lenses may also be employed in the field lens group to increase the bandwidth of the objective, a modification discussed generally in U.S. Pat. No. 5,717,518.

Figure 4:
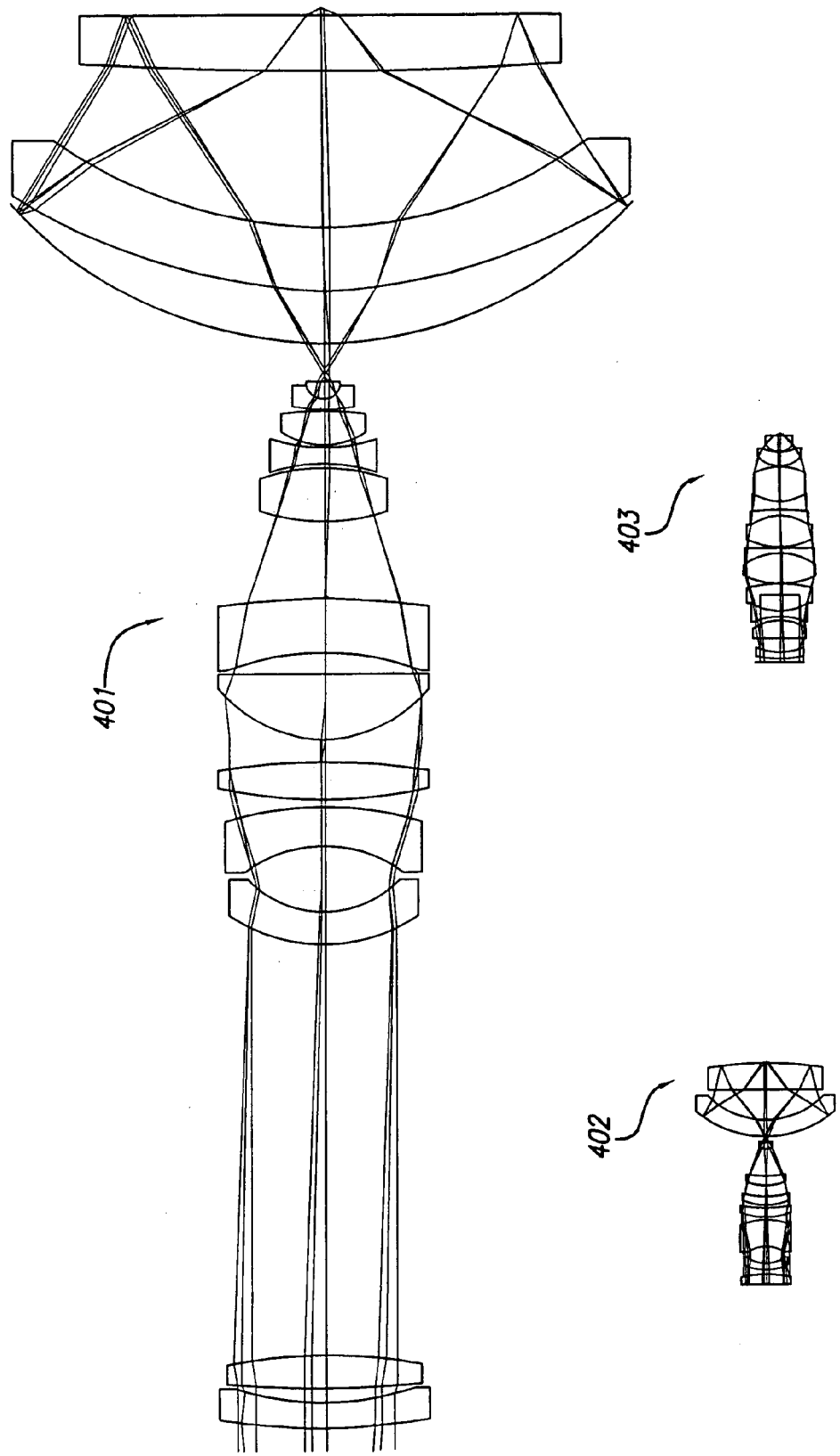
FIG. 4 is a size comparison between the objective of the design presented in FIG. 2, the reduced size catadioptric objective of FIG. 3, and a standard microscope objective.
Figure 14:
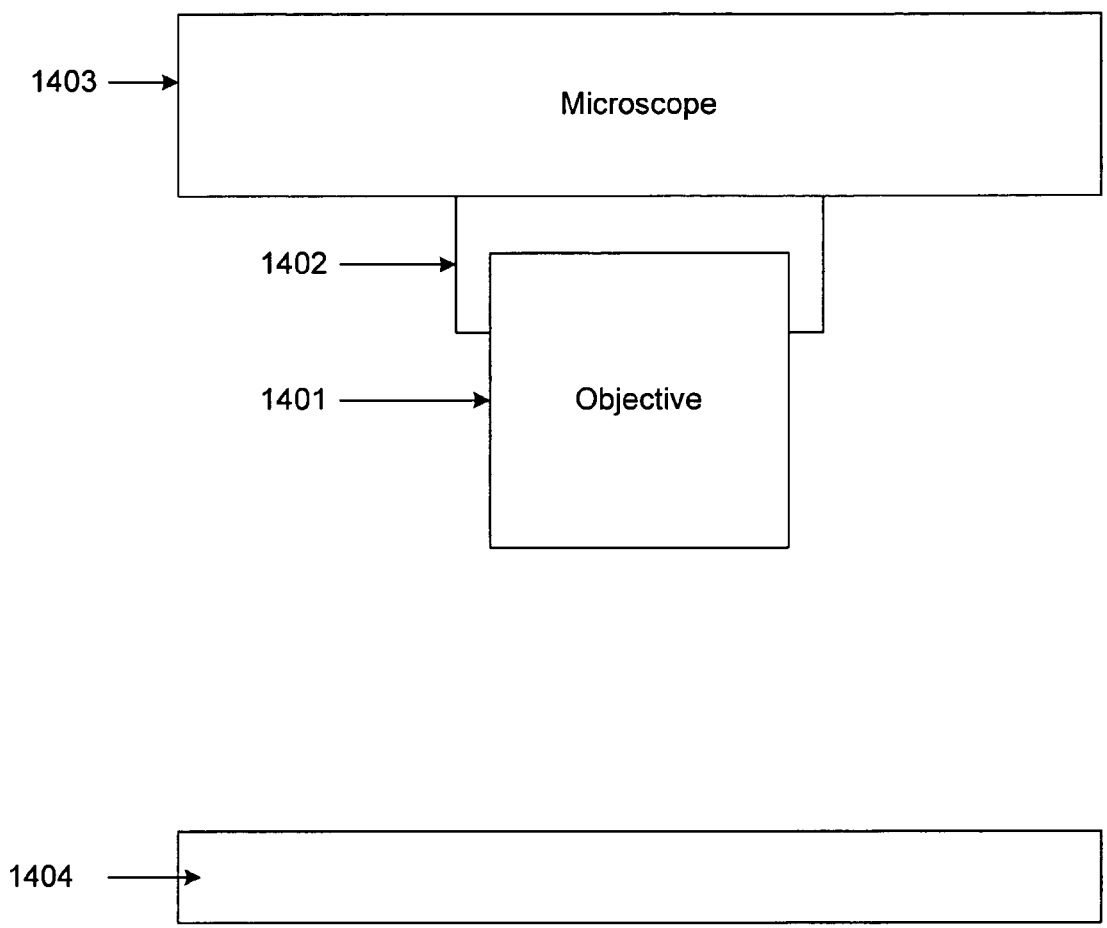
FIG. 14 conceptually represents use of an objective in a flange in a microscope.

As noted in FIG. 3, the objective has a diameter of 26 millimeters, which is significantly smaller than objectives previously employed in this wavelength range. The small size of this objective is particularly beneficial in view of the performance characteristics of the objective. The objective can be mounted in a standard microscope turret with a 45 mm flange-to-object separation. A conceptual drawing (not to scale) of an objective 1401, a flange 1402, and a microscope 1403 is illustrated in FIG. 14, where the flange in the aforementioned situation is approximately 45 mm from specimen 1404. The objective supports a numerical aperture of approximately 0.90, a field size of approximately 0.4 mm, has a corrected bandwidth from approximately 285–313nm, and a polychromatic wavefront error of less than approximately 0.038 waves. A size comparison between the objective of the design presented in FIG. 2, the design of FIG. 3, and a standard microscope objective is shown in FIG. 4.

As is true with any optical design, certain tradeoffs may be made to improve performance characteristics depending on the desired application of the objective or optical design. It is possible, for example, to sacrifice bandwidth, field size, numerical aperture, and/or objective size to enhance one of the aforementioned performance characteristics, depending on the application. For example, optimizing for lower or higher NAs is possible. Reducing the NA can reduce the manufacturing tolerance and the outer diameter of the objective. Lower NA designs can provide larger field sizes and larger bandwidths. Lower NA designs with the same performance and less optical elements are also possible. Optimizing for higher NAs is also possible. Optimizing the design for higher NAs would generally limit the field size or bandwidth and may require slightly increased diameter objective elements.

The design of FIG. 3 has a field size of 0.4 mm in diameter. Such a relatively large field size can support a large high speed sensor. For example, using an imaging magnification of 200×, a sensor having an 80 mm diagonal can be supported. The design of FIG. 3 can also be extended to larger field sizes by allowing larger lens diameters and re-optimizing the elements, again a task within the range of those skilled in the art.

The design of FIG. 3 has a relatively low intrinsic polychromatic wavefront aberration over the design bandwidth from approximately 285–320 nm. The low wavefront aberration provides increased manufacturing headroom, or ease of manufacture, while enabling relatively high performance of the manufactured objective. The design of FIG. 3 provides good performance over narrow bands from approximately 266 to 365 nm if the objective is refocused, again a task that may be readily performed by one of ordinary skill in the art. Use of the objective of FIG. 3 in this narrow band range allows use of lasers or narrow lamp spectra, such as the 365 nm line of lasers. The design is also self corrected. Self corrected in this context means that the objective does not require any additional optical components to correct aberrations in order to achieve the design specifications. The ability to self-correct tends to simplify optical testing metrology and optical alignment to other self corrected imaging optics. Further correction of residual aberrations using additional imaging optics is also possible. Further aberration correction can increase optical specifications such as bandwidth or field size.

Figure 5A:
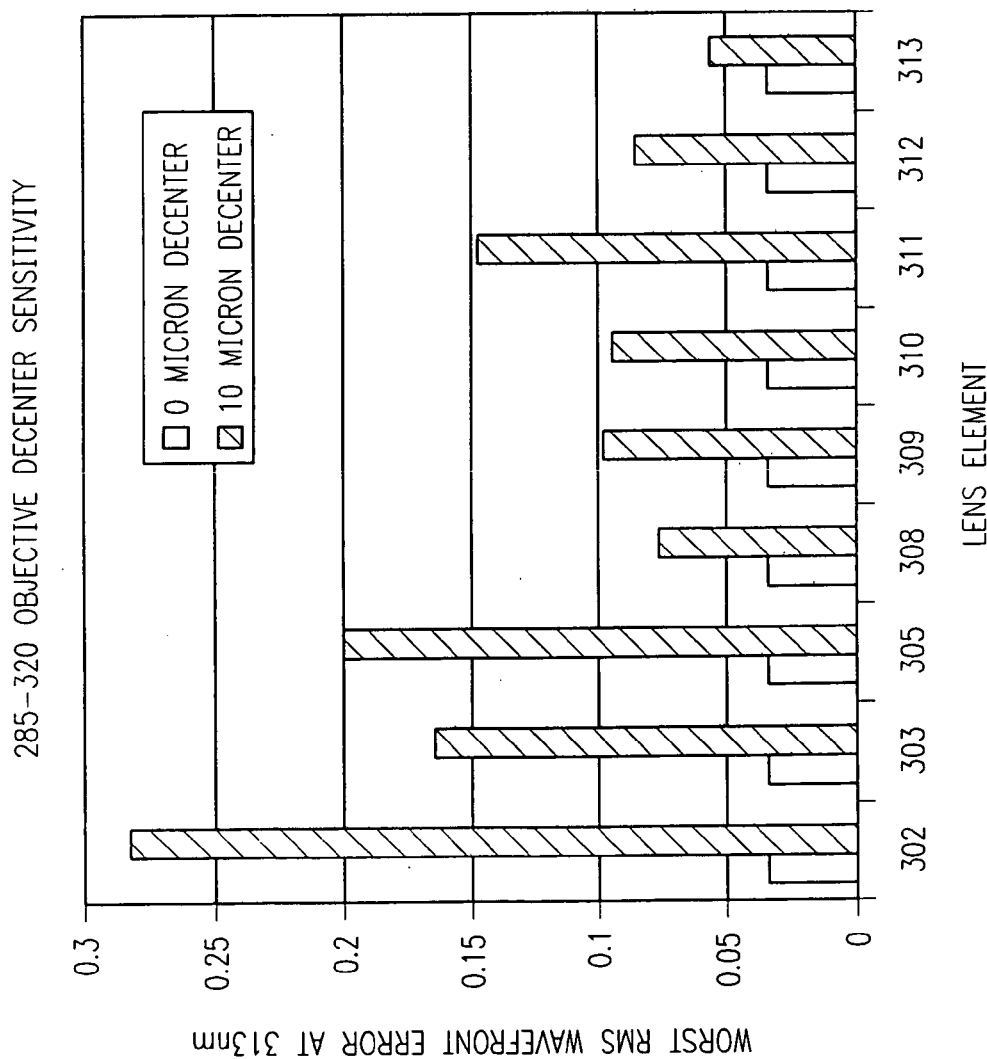
FIG. 5A is a graph of decenter sensitivity for the objective design of FIG. 3.

One advantage of the present design is relatively loose manufacturing tolerances. Specifically, the decenter tolerances of individual lenses are relatively loose. Having loose decenter tolerances for individual lens elements tends to simplify the manufacturing requirements of the system. Any lens decenters encounterd during manufacturing may cause on-axis coma, a phenomenon that can be difficult to compensate without introducing other residual aberrations. Using the present design, it is possible to reduce the decenter sensitivity of the lens and mirror elements by carefully balancing the aberrations within the catadioptric group 301 and focusing lens group 307. Total aberrations of the catadioptric group may be optimized using the design of FIG. 3 to balance the compensation required by the field lens group 304 and focusing lens group 307. FIG. 5A shows the decenter sensitivity for the objective. A 10 micron decenter, without using any compensators, introduces less than approximately 0.2 waves of aberration in all elements except lens 302. A 10 micron decenter without compensators introduces approximately 0.29 waves of aberration. In the design presented in FIG. 3, average tolerance is approximately 0.13 waves of error at approximately 313 nm. Further balancing the tolerances on the elements in the catadioptric group 301 is also possible.

The decenter tolerances also scale with the wavelength being used. This is because the optical path errors introduced for small decenters are not a strong function of wavelength. For example, if a 10 micron decenter introduces 0.2 waves of aberration at a 266 nm wavelength, this is equivalent to a 0.0532 micron optical path error. The system operating at 365 nm would only introduce 0.15 waves of aberration for the same decenter. This would have the same 0.0532 micron optical path error.

Figure 5B:
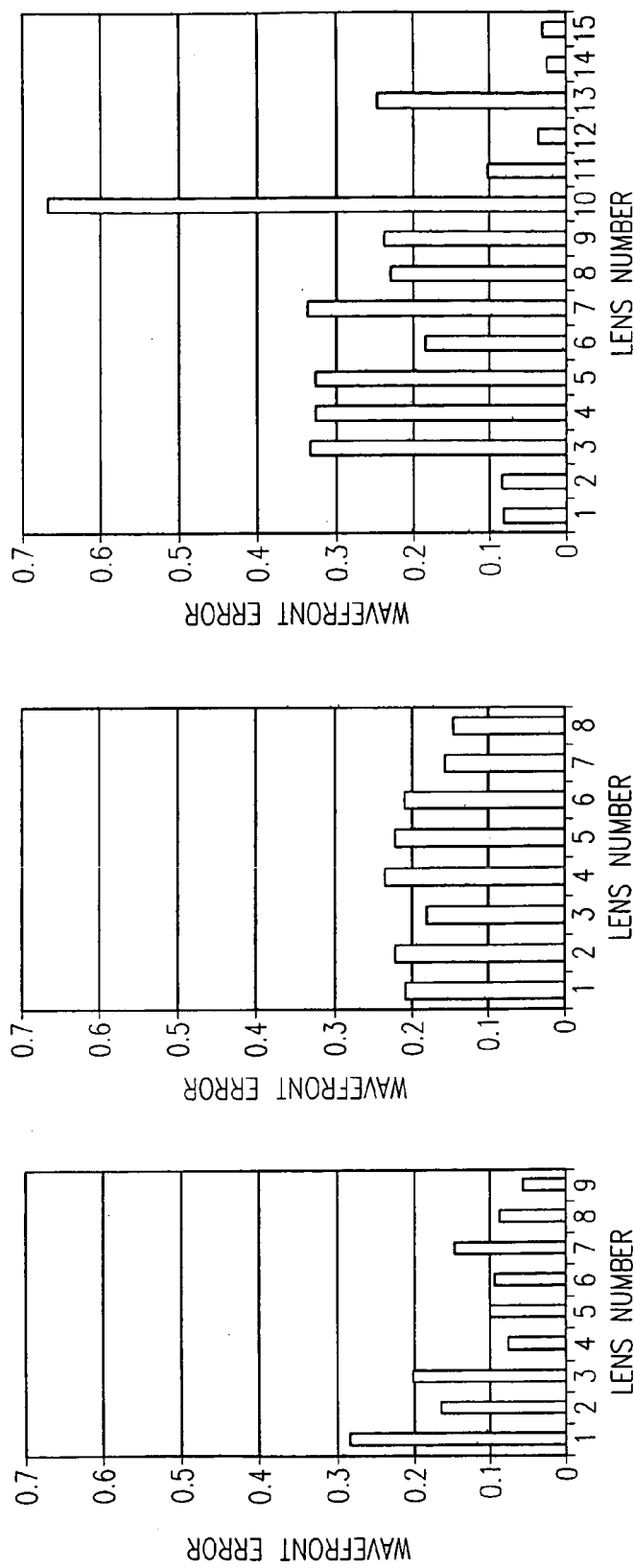
FIG. 5B presents a sensitivity comparison between the design of FIG. 3, a UV refractive objective corrected from 365–436 nm, and a catadioptric objective based on the design of FIG. 2.

These tolerances tend to be looser than other catadioptric designs in similar environments, and tend to be looser than most standard refractive objective designs. FIG. 5B presents a sensitivity comparison between the design of FIG. 3, a UV refractive objective corrected from 365–436 nm, and a catadioptric objective based on the design shown in FIG. 2. Generally, in the plots of FIG. 5B, a value lower on the vertical scale indicates a more desirable design. Wavefront error is plotted for a 10 micron decenter for each element without compensation. Average sensitivity is less than the refractive objective and much less than the sensitivity of the catadioptric objective design similar to that from the design of FIG. 2.

This design also has very loose tolerances on the index of the glass material. This is largely because the design is of a single material and does not rely on the index difference of two different glass materials to compensate for chromatic aberrations. This also makes the design very insensitive to temperature changes. Standard designs use multiple glass materials with different index profiles for color correction. The index profile for each material changes differently with temperature. This changes the chromatic correction for temperatures other than the design temperature and reduces the performance.

The objective design presented herein can support various modes of illumination and imaging. Modes supported can include bright field and a variety of dark field illumination and imaging modes. Other modes such as confocal, differential interference contrast, polarization contrast may also be supported using the present design.

Bright field mode is commonly used in microscope systems. The advantage of bright field illumination is the clarity of the image produced. Using bright field illumination with an objective such as that presented herein provides a relatively accurate representation of object feature size multiplied by the magnification of the optical system. The objective and optical components presented herein can be readily used with image comparison and processing algorithms for computerized object detection and classification. Brightfield mode typically uses a broad band incoherent light source, but it may be possible to use laser illumination sources using slightly modified illumination system components employing the design presented herein.

The confocal mode has been used for optical sectioning to resolve height differences of object features. Most imaging modes have difficulty detecting changes in the height of features. The confocal mode forms separate images of object features at each height of interest. Comparison of the images then shows the relative heights of different features. Confocal mode may be employed using the design presented herein.

Dark field mode has been used to detect features on objects. The advantage of the dark field mode is that flat specular areas scatter very little light toward the detector, resulting in a dark image. Surface features or objects protruding above the object tend to scatter light toward the detector. Thus, in inspecting objects like semiconductor wafers, dark field imaging produces an image of features, particles, or other irregularities on a dark background. The present design may be employed with dark field mode illumination. Dark field mode provides a large resultant signal upon striking small features that scatter light. This large resultant signal allows larger pixels to be employed for a given feature size, permitting faster object inspections. Fourier filtering can also be used to minimize the repeating pattern signal and enhance the defect signal to noise ratio during dark field inspection.

Many different dark field modes exist, each including a specific illumination and collection scheme. Illumination and collection schemes can be chosen such that the scattered and diffracted light collected from the object provides an acceptable signal-to-noise ratio. Certain optical systems use different dark field imaging modes including ring dark field, laser directional dark field, double dark field, and central dark ground. Each of these dark field imaging modes may be employed in the present design.

Figure 6:
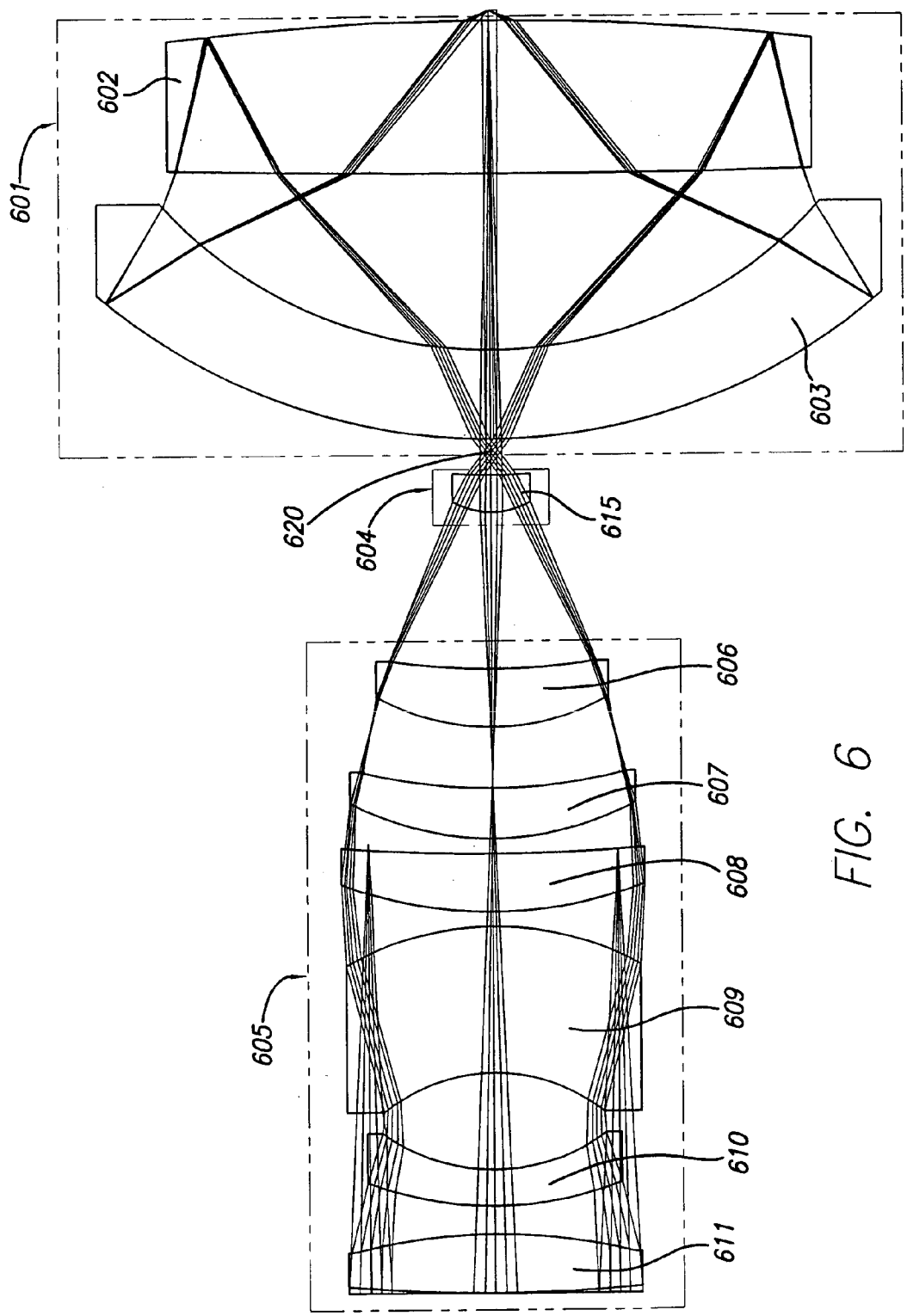
FIG. 6 is an alternate aspect of the reduced size catadioptric objective in accordance with the present invention.

An alternate aspect of the present design presents an objective with increased bandwidth. This aspect of the design is presented in FIG. 6. The main difference between the design of FIG. 6 and that of FIG. 3 is the tradeoff between bandwidth and field size. The objective of the design of FIG. 6 is corrected over a broader bandwidth from 266 to 320 nm but has a relatively smaller field, approximately 0.28 mm, as compared with the 0.4 mm of the design of FIG. 3. The design of FIG. 6 maintains the high approximately 0.90 numerical aperture. The worst case polychromatic wavefront error for the FIG. 6 design is approximately 0.036 waves.

From FIG. 6, the catadioptric group 601 includes a Mangin mirror element 602, which is a reflectively coated lens element, and a concave spherical reflector 603, which is also a reflectively coated lens element. Both Mangin mirror element 602 and concave spherical reflector 603 have central optical apertures where reflective material is absent. The absence of reflective material, in the center of the components shown, allows light to pass from the object or specimen 600 (not shown) through Mangin mirror element 602, reflect from the second surface of concave spherical reflector 603 onto the Mangin mirror element 602, and transmit through concave spherical reflector 603 to form an intermediate image 620 between concave spherical reflector 603 and field lens group 604, comprising a single field lens 615 in this aspect of the design.

The focusing lens group 605 employs multiple lens elements, in this aspect the six lens elements 606, 607, 608, 609, 610, and 611, which may all be formed from a single type of material. The focusing lens group 605 collects light from the field lens group 604, including the intermediate image 620.

The design presented in FIG. 6 has the advantages and flexibility described with respect to the design of FIG. 3. The lens prescription for this embodiment is shown in Table 2.

TABLE 2

Prescription for lenses for the design of FIG. 6

| Surf | Radius | Thickness | Glass | Diameter |
|---|---|---|---|---|
| OBJ | Infinity | Infinity | | 0 |
| 1 | Infinity | 16.20723 | | 9.020484 |
| STO | Infinity | −16.20723 | | 8 |
| 3 | 64.63011 | 2 | FUSED SILICA | 9.010584 |
| 4 | −19.00905 | 1.675169 | | 8.894847 |
| 5 | 10.3536 | 1.249991 | FUSED SILICA | 7.776084 |
| 6 | 5.91317 | 3.249904 | | 6.942948 |
| 7 | −5.240171 | 5.243182 | FUSED SILICA | 6.855225 |
| 8 | −9.11876 | 0.5 | | 9.288367 |
| 9 | 16.20784 | 2 | FUSED SILICA | 9.638653 |
| 10 | Infinity | 0.5 | | 9.499901 |
| 11 | 8.951438 | 3.573584 | FUSED SILICA | 9.210718 |
| 12 | 12.83071 | 0.5 | | 7.808034 |
| 13 | 7.107306 | 2 | FUSED SILICA | 7.502914 |
| 14 | 29.37779 | 5.583862 | | 6.837774 |
| 15 | 2.252897 | 1.3 | FUSED SILICA | 2.391106 |
| 16 | 11.8636 | 0.668164 | | 1.486574 |
| 17 | Infinity | 0.499742 | | 0.548495 |
| 18 | 17.95894 | 3.09472 | FUSED SILICA | 25 |
| 19 | 13.41421 | 6.156826 | | 21 |
| 20 | 1134 | 5.204856 | FUSED SILICA | 20.5 |
| 21 | −78 | −5.204856 | MIRROR | 20.5 |
| 22 | 1134 | −6.156826 | | 20.5 |
| 23 | 13.41421 | −3.09472 | FUSED SILICA | 21 |
| 24 | 17.95894 | 3.09472 | MIRROR | 25 |
| 25 | 13.41421 | 6.156826 | | 21 |
| 26 | 1134 | 5.204856 | FUSED SILICA | 20.5 |
| 27 | −78 | 0.3 | | 20.5 |
| IMA | Infinity | | | 0.289101 |

A further aspect of the present design uses a tube lens to correct for residual aberrations in the objective. Residual aberrations are primarily the chromatic variation of distortion and higher order lateral color. These residual aberrations are related to use of the Offner field lens in the objective. One method to correct these residual aberrations is to employ a second glass material in the Offner field lens. Use of a second material can lead to an optical design with large elements and relatively tight tolerances. The alternative approach presented in this design is to use additional imaging optics to correct for residual aberrations. Such a design can produce a system having high NA, large field size, small lens diameter, as well as relatively loose tolerances.

Correcting these residual aberrations can further increase the field size or increase the bandwidth while maintaining the field size. The design of FIG. 7A maintains the same approximately 0.4 mm field size as in the design of FIG. 3 and extends the bandwidth to cover 266 to 365 nm without need for refocusing. The worst case polychromatic wavefront error for the design of FIG. 7A is approximately 0.036 waves.

The design includes two air spaced doublets 701, 702, 703, and 704, the doublets 701–704 fashioned from fused silica and calcium fluoride. The doublets 701–704 focus light through three fused silica lens elements, namely lens elements 705, 706, and 707. These lens elements 705–707 are in proximity to an internal field. Light is then collimated by an air spaced triplet 708, 709, and 710. Light then forms an external pupil at 711. The external pupil 711 can be used for placing dark field apertures, Fourier filters, and beamsplitters.

Figure 7A:
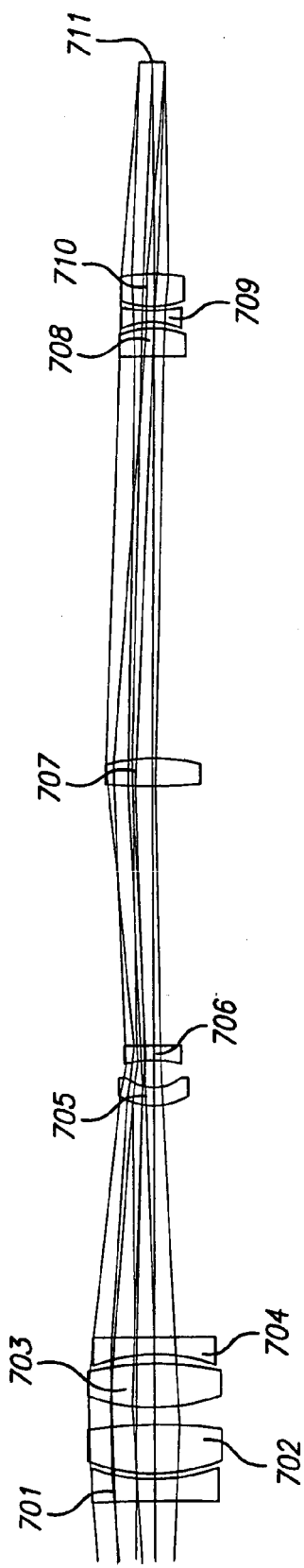
FIG. 7A illustrates a tube lens arrangement in accordance with the present invention.

The lens prescription for the aspect of the invention illustrated in FIG. 7A is shown in Table 3.

TABLE 3

Prescription for lenses for the design of FIG. 7A

| Surf | Radius | Thickness | Glass | Diameter |
|---|---|---|---|---|
| OBJ | Infinity | 0.3 | | 0.4 |
| 1 | 78 | 5.155765 | FUSED SILICA | 21 |
| 2 | −1031.094 | 6.132752 | | 21 |
| 3 | −13.38766 | 3.334036 | FUSED SILICA | 21.5 |
| 4 | −18.2281 | −3.334036 | MIRROR | 25.5 |
| 5 | −13.38766 | −6.132752 | | 21.5 |
| 6 | −1031.094 | −5.155765 | FUSED SILICA | 21 |
| 7 | 78 | 5.155765 | MIRROR | 21 |
| 8 | −1031.094 | 6.132752 | | 21 |
| 9 | −13.38766 | 3.334036 | FUSED SILICA | 21.5 |
| 10 | −18.2281 | 0.598511 | | 25.5 |
| 11 | Infinity | 0.595647 | | 0.87265 |
| 12 | −22.67364 | 1.496994 | FUSED SILICA | 1.716759 |
| 13 | −2.487035 | 5.332021 | | 2.721696 |
| 14 | −24.12325 | 1.749722 | FUSED SILICA | 6.761726 |
| 15 | −8.563906 | 1.647307 | | 7.426322 |
| 16 | Infinity | 1.017137 | | 8.707626 |
| 17 | −23.20559 | 1.75 | FUSED SILICA | 9.034138 |
| 18 | −10.09888 | 0.499806 | | 9.544791 |
| 19 | 459.357 | 2 | FUSED SILICA | 10.00487 |
| 20 | −12.90167 | 0.499731 | | 10.16545 |
| 21 | 9.888518 | 5.284916 | FUSED SILICA | 9.738469 |
| 22 | 5.468369 | 3.606566 | | 7.299015 |
| 23 | −6.158311 | 1.499744 | FUSED SILICA | 7.434168 |
| 24 | −10.89758 | 0.499623 | | 8.474502 |
| 25 | 18.52911 | 2 | FUSED SILICA | 9.287792 |
| 26 | −68.1321 | −15.25736 | | 9.417208 |
| STO | Infinity | 15.25736 | | 8.09706 |
| 28 | Infinity | 34.89506 | | 9.431455 |
| 29 | — | 0 | | — |
| 30 | Infinity | 6 | FUSED SILICA | 18.46143 |
| 31 | Infinity | 0 | | 25.39024 |
| 32 | — | 0 | | — |
| 33 | Infinity | 30 | | 17.16851 |
| 34 | — | 0 | | — |
| 35 | Infinity | 6 | FUSED SILICA | 26.81778 |
| 36 | Infinity | 0 | | 20.63295 |
| 37 | — | 0 | | — |
| 38 | Infinity | 81 | | 15.2277 |
| 39 | −159.7003 | 4 | FUSED SILICA | 22.27788 |
| 40 | 37.47386 | 0.999856 | | 22.92295 |
| 41 | 33.36497 | 9 | CAF2 | 23.58799 |
| 42 | −80.14523 | 3.436442 | | 24.07579 |
| 43 | 38.4464 | 8 | CAF2 | 23.97432 |
| 44 | −53.0633 | 1.5 | | 22.95647 |
| 45 | −39.45511 | 3 | FUSED SILICA | 22.35342 |
| 46 | 1094.058 | 43.27621 | | 21.67501 |

TABLE 3-continued

Prescription for lenses for the design of FIG. 7A

| Surf | Radius | Thickness | Glass | Diameter |
|---|---|---|---|---|
| 47 | 10.8487 | 3.18507 | FUSED SILICA | 12.40192 |
| 48 | 8.96916 | 4.999989 | | 10.71199 |
| 49 | −24.58978 | 2.5 | FUSED SILICA | 10.26452 |
| 50 | 117.1346 | 47.95638 | | 10.34545 |
| 51 | 175.9777 | 5 | FUSED SILICA | 16.71625 |
| 52 | −37.37344 | 74.18151 | | 17.10185 |
| 53 | −1113.4 | 5 | CAF2 | 11.5593 |
| 54 | −14.94822 | 0.99955 | | 11.38304 |
| 55 | −13.4032 | 2 | FUSED SILICA | 10.93698 |
| 56 | 18.26209 | 0.99969 | | 10.92178 |
| 57 | 17.51017 | 6 | CAF2 | 11.25199 |
| 58 | −33.75194 | 38.51994 | | 11.218 |
| 59 | — | 100 | | 4.910667 |
| IMA | Infinity | | | 16.34334 |

The tube lens design of FIG. 7A uses only fused silica and calcium fluoride. Both of these materials have transmissions from approximately 190 nm through the infrared. Thus a tube lens can be designed to operate with an objective that can be re-optimized for different center wavelengths. Other tube lens magnifications may be achieved using this design. The design of FIG. 7A can be re-optimized for different afocal magnifications depending on the desired overall magnification. Using the design presented herein, a focusing tube lens that directly forms an image that can expose a high speed sensor may be realized.

An additional aspect of the present design uses a tube lens to correct for residual aberrations in the objective. Correcting these residual aberrations can increase the field size or increase the bandwidth while maintaining the field size. Residual aberrations are primarily the chromatic variation of distortion and higher order lateral color. The design of FIG. 7B maintains the same approximately 0.4 mm field size as in the design of FIG. 3 and extends the bandwidth to cover 266 to 405 nm without need for refocusing. The worst case polychromatic wavefront error for the design of FIG. 7B is approximately 0.041 waves.

Figure 7B:
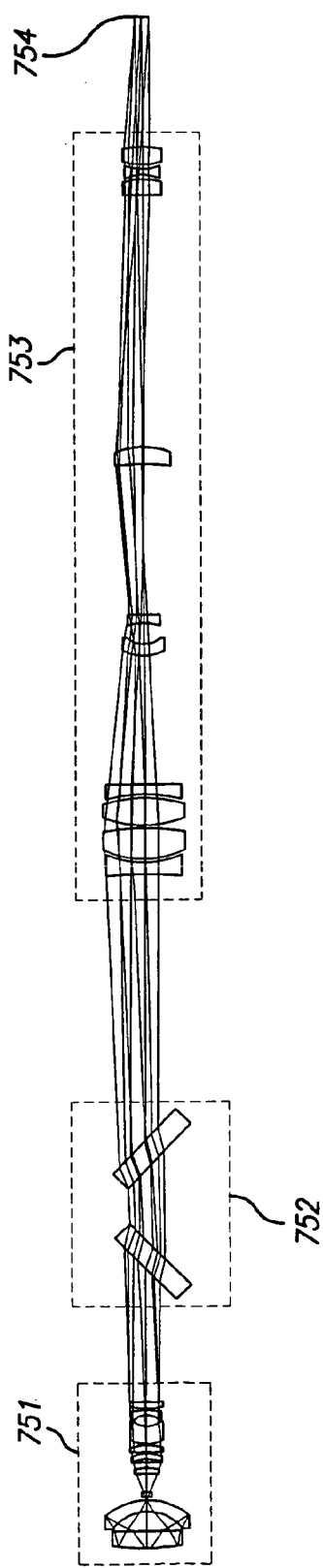
FIG. 7B illustrates an objective and tube lens corrected from 266–405 nm with a 0.4 mm diameter field.

The design in FIG. 7B is composed of an objective 751 that collects the light and a tube lens 753 that corrects residual aberations. A set of lenses 752 may be provided to enhance performance. To achieve additional bandwidth beyond the design of FIG. 7A, the objective and tube lens of FIG. 7B are partially optimized together. Partial combined optimization of the objective and tube lens allows for further correction of the limiting off axis lateral color and chromatic variation of distortion. The tube lens forms an external pupil 754 that can be used in the same fashion as the design of FIG. 7A. The design presented in FIG. 7B also shows optional beamsplitter elements 754 that can be used to fold in illumination and autofocus light. The lens prescription for the aspect of the invention illustrated in FIG. 7B is shown in Table 4.

TABLE 4

Prescription for lenses for the design of FIG. 7B

| Surf | Radius | Thickness | Glass | Diameter |
|---|---|---|---|---|
| OBJ | Infinity | 0.300 | | 0.4 |
| 1 | 78.000 | 5.168 | Fused silica | 21 |
| 2 | −850.121 | 6.031 | | 21 |
| 3 | −13.361 | 3.505 | Fused silica | 21.5 |
| 4 | −18.352 | −3.505 | MIRROR | 25.5 |

TABLE 4-continued

Prescription for lenses for the design of FIG. 7B

| Surf | Radius | Thickness | Glass | Diameter |
|---|---|---|---|---|
| 5 | −13.361 | −6.031 | | 21.5 |
| 6 | −850.121 | −5.168 | Fused silica | 21 |
| 7 | 78.000 | 5.168 | MIRROR | 21 |
| 8 | −850.121 | 6.031 | | 21 |
| 9 | −13.361 | 3.505 | Fused silica | 21.5 |
| 10 | −18.352 | 0.599 | | 25.5 |
| 11 | Infinity | 0.598 | | 0.8876633 |
| 12 | −22.089 | 1.498 | Fused silica | 1.735372 |
| 13 | −2.492 | 5.525 | | 2.742536 |
| 14 | −25.242 | 1.750 | Fused silica | 6.958087 |
| 15 | −8.752 | 1.574 | | 7.613493 |
| STO | Infinity | 1.011 | | 8.782304 |
| 17 | −26.420 | 1.750 | Fused silica | 9.130406 |
| 18 | −10.453 | 0.500 | | 9.615398 |
| 19 | 214.479 | 2.000 | Fused silica | 10.09149 |
| 20 | −12.858 | 0.500 | | 10.245 |
| 21 | 10.710 | 5.074 | Fused silica | 9.775169 |
| 22 | 5.729 | 3.622 | | 7.468521 |
| 23 | −6.365 | 1.499 | Fused silica | 7.601525 |
| 24 | −11.721 | 0.499 | | 8.660195 |
| 25 | 20.390 | 2.000 | Fused silica | 9.505927 |
| 26 | −47.176 | −15.391 | | 9.654623 |
| 27 | Infinity | 15.391 | | 8.373404 |
| 28 | Infinity | 40.197 | | 9.675574 |
| 29 | — | 0.000 | | |
| 30 | Infinity | 6.000 | Fused silica | 19.30992 |
| 31 | Infinity | 0.000 | | 26.25127 |
| 32 | — | 0.000 | | |
| 33 | Infinity | 30.000 | | 17.76485 |
| 34 | — | 0.000 | | — |
| 35 | Infinity | 6.000 | Fused silica | 27.58405 |
| 36 | Infinity | 0.000 | | 21.36646 |
| 37 | — | 0.000 | | — |
| 38 | Infinity | 81.000 | | 15.75755 |
| 39 | −140.860 | 4.000 | Fused silica | 22.67915 |
| 40 | 35.044 | 1.068 | | 23.39086 |
| 41 | 31.623 | 9.000 | CAF2 | 24.17115 |
| 42 | −71.279 | 1.000 | | 24.64826 |
| 43 | 34.991 | 8.000 | CAF2 | 24.5185 |
| 44 | −50.752 | 1.500 | | 23.4315 |
| 45 | −37.766 | 3.000 | Fused silica | 22.75917 |
| 46 | 331.537 | 39.138 | | 21.89289 |
| 47 | 11.729 | 3.402 | Fused silica | 12.61895 |
| 48 | 9.275 | 6.254 | | 10.82904 |
| 49 | −22.713 | 2.500 | Fused silica | 10.19172 |
| 50 | 149.521 | 45.554 | | 10.31249 |
| 51 | −142.117 | 5.000 | Fused silica | 16.06325 |
| 52 | −25.943 | 76.816 | | 16.73351 |
| 53 | −369.224 | 5.000 | CAF2 | 11.62667 |
| 54 | −14.234 | 1.000 | | 11.50051 |
| 55 | −12.790 | 2.000 | Fused silica | 11.04605 |
| 56 | 20.324 | 1.000 | | 11.08561 |
| 57 | 18.583 | 5.500 | CAF2 | 11.41199 |
| 58 | −32.851 | 38.519 | | 11.39769 |
| 59 | — | 100.000 | | 5.11369 |
| IMA | Infinity | | | 16.29315 |

The design spectrum can be limited to 266–365 nm and reoptimized for a 0.5 mm field size. The tube lens design of FIG. 7B also uses only fused silica and calcium fluoride and has all the flexibility for reoptimizing presented for the design in FIG. 7A.

The maximum numerical apertures of the current designs approaches or exceeds 0.9. The numerical aperture of a design may be reduced by placing a variable aperture at the aperture stop of the objective, effectively limiting the illumination and imaging light angles. It is also possible to control illumination and imaging angles independently by placing apertures at an external pupil plane using imaging optics such as the tube lens designs in FIG. 7A or FIG. 7B. The numerical aperture of the illumination may be reduced by underfilling the objective aperture with the illumination light. Such a design enables the full imaging NA to be used.

An alternate aspect of the current design is an objective with increased field size. This aspect of the design is presented in FIG. 7C. The main difference between the design of FIG. 7C and that of FIG. 3 is the increase field size from 0.4 mm to 1.0 mm and an increase in lens diameter from 25 mm to 58 mm. In contrast, this field diameter is the same as in the design of FIG. 2. Maximum lens diameter of this design is much smaller than the design of FIG. 2. The objective of the design of FIG. 7C is corrected over a bandwidth from 285 to 320 nm, maintains the high 0.90 numerical aperture, and the worst case polychromatic wavefront error for the FIG. 7C design is approximately 0.033 waves.

Figure 7C:
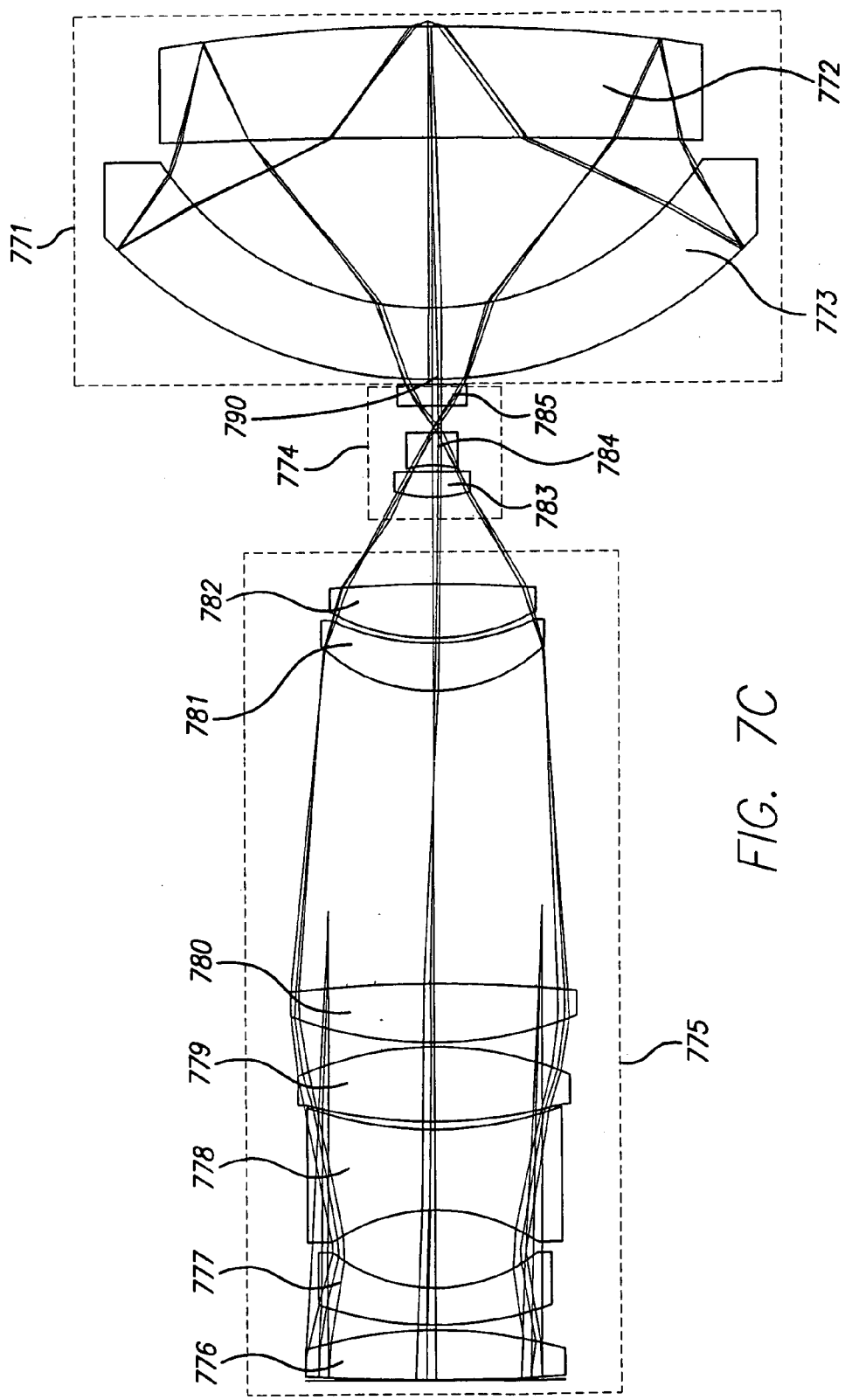
FIG. 7C illustrates an objective design with a 1 mm field size and diameter of approximately 58 mm.

From FIG. 7C, the catadioptric group 771 includes a Mangin mirror element 772, which is a reflectively coated lens element, and a concave spherical reflector 773, which is also a reflectively coated lens element. Both Mangin mirror element 772 and concave spherical reflector 773 have central optical apertures where reflective material is absent. The absence of reflective material, in the center of the components shown, allows light to pass from the object or specimen 770 (not shown) through Mangin mirror element 772, reflect from the second surface of concave spherical reflector 773 onto the Mangin mirror element 772, and transmit through concave spherical reflector 773 to form an intermediate image 790 between concave spherical reflector 773 and field lens group 774, comprising three field lens elements 783, 784, and 785 in this aspect of the design.

The focusing lens group 775 employs multiple lens elements, in this aspect the seven lens elements 776, 779, 780, 781, and 782, which may all be formed from a single type of material. The focusing lens group 775 collects light from the field lens group 774, including the intermediate image 790.

The design presented in FIG. 6 has the advantages and flexibility described with respect to the design of FIG. 3. The lens prescription for this design is shown in Table 5.

TABLE 5

Prescription for lenses for the design of FIG. 7C

| Surf | Radius | Thickness | Glass | Diameter |
|---|---|---|---|---|
| OBJ | Infinity | Infinity | | 0.000 |
| 1 | Infinity | 43.913 | | 23.946 |
| STO | Infinity | −43.913 | | 20.000 |
| 3 | 349.851 | 4.500 | Fused silica | 23.928 |
| 4 | −43.383 | 0.500 | | 23.709 |
| 5 | 30.361 | 3.650 | Fused silica | 21.950 |
| 6 | 16.181 | 7.177 | | 19.386 |
| 7 | −17.138 | 7.305 | Fused silica | 19.277 |
| 8 | 32.672 | 0.872 | | 23.722 |
| 9 | 47.511 | 7.000 | Fused silica | 23.916 |
| 10 | −30.308 | 0.500 | | 25.201 |
| 11 | 37.466 | 5.500 | Fused silica | 26.737 |
| 12 | −147.458 | 27.319 | | 26.555 |
| 13 | 14.910 | 4.500 | Fused silica | 21.011 |
| 14 | 22.738 | 0.500 | | 19.515 |
| 15 | 20.121 | 5.000 | Fused silica | 19.161 |
| 16 | −127.415 | 7.984 | | 17.640 |
| 17 | 12.578 | 2.500 | Fused silica | 7.187 |
| 18 | −46.414 | 0.500 | | 5.333 |
| 19 | −12.279 | 3.131 | Fused silica | 4.668 |
| 20 | −15.865 | 2.594 | | 1.955 |
| 21 | −576.001 | 2.250 | Fused silica | 4.516 |
| 22 | −20.181 | 0.250 | | 6.277 |
| 23 | 40.385 | 6.603 | Fused silica | 60.000 |
| 24 | 29.574 | 15.917 | | 50.000 |
| 25 | −777.423 | 10.056 | Fused silica | 50.000 |
| 26 | −202.605 | −10.056 | MIRROR | 50.000 |
| 27 | −777.423 | −15.917 | | 50.000 |
| 28 | 29.574 | −6.603 | Fused silica | 50.000 |
| 29 | 40.385 | 6.603 | MIRROR | 60.000 |
| 30 | 29.574 | 15.917 | | 50.000 |
| 31 | −777.423 | 10.056 | Fused silica | 50.000 |
| 32 | −202.605 | 0.750 | | 50.000 |
| IMA | Infinity | | | 1.005 |

Figure 8:
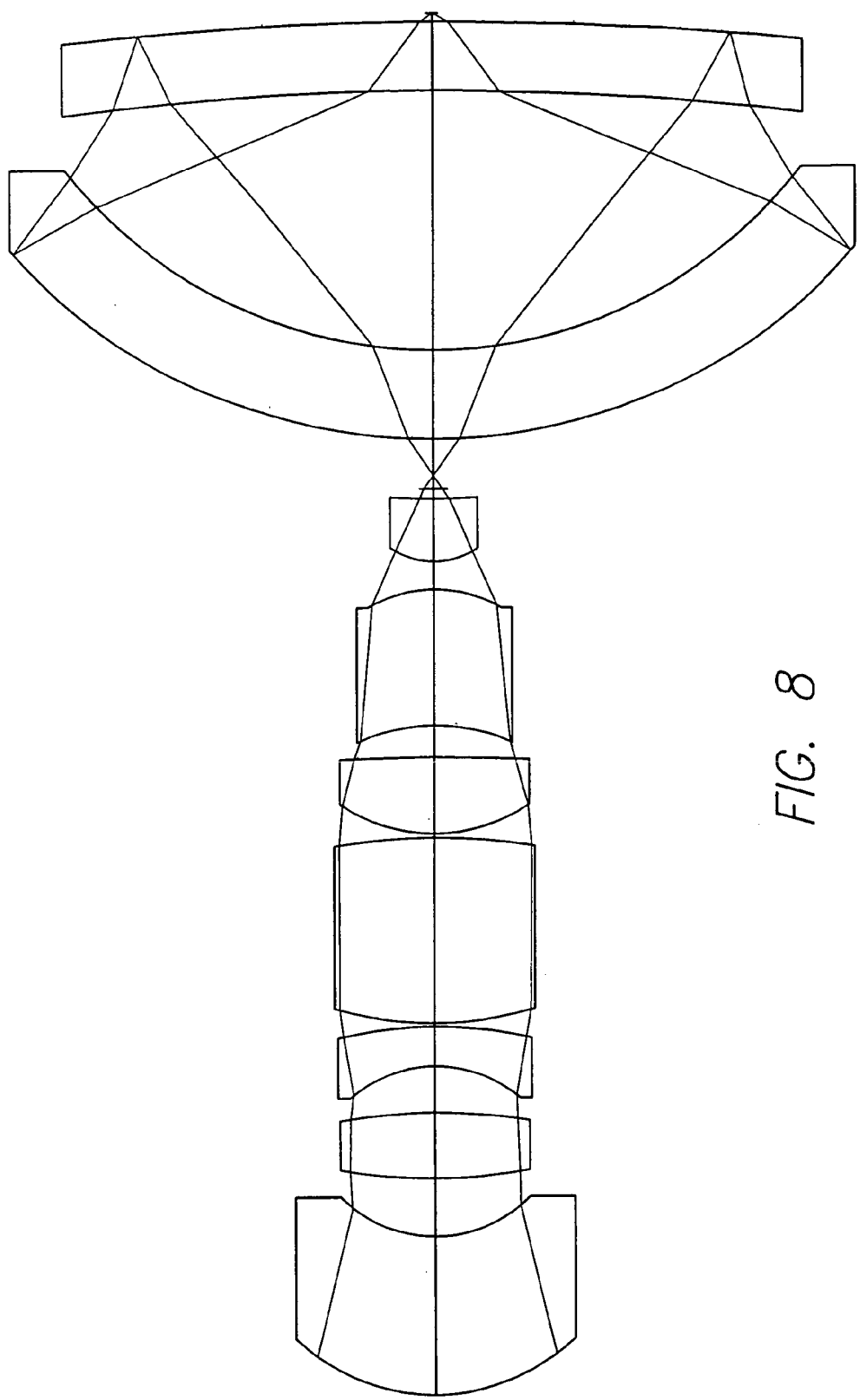
FIG. 8 is a design able to perform in the presence of wavelengths from approximately 311–315 nm, having approximately 26 mm diameter, a field size of approximately 0.28 mm, and NA of approximately 0.90.

Further aspects of the design are presented in FIGS. 8–11, where FIG. 8 is a design able to perform in the presence of wavelengths from approximately 311–315 nm, having approximately 26 mm diameter, a field size approximately 0.28 mm, and NA of approximately 0.90. The lens prescription for this design is shown in Table 6.

TABLE 6

Prescription for lenses for the design of FIG. 8

| Surf | Radius | Thickness | Glass | Diameter |
|---|---|---|---|---|
| OBJ | Infinity | Infinity | | 0.000 |
| 1 | Infinity | 18.849 | | 8.538 |
| STO | Infinity | −18.849 | | 7.220 |
| 3 | 6.048 | 4.786 | Fused silica | 8.419 |
| 4 | 4.149 | 1.727 | | 5.777 |
| 5 | 19.860 | 2.000 | Fused silica | 5.724 |
| 6 | −17.207 | 1.449 | | 5.502 |
| 7 | −3.955 | 1.200 | Fused silica | 5.247 |
| 8 | −12.991 | 0.100 | | 5.861 |
| 9 | 10.518 | 5.617 | Fused silica | 6.098 |
| 10 | −15.147 | 0.100 | | 5.985 |
| 11 | 4.995 | 2.249 | Fused silica | 5.701 |
| 12 | −159.821 | 0.999 | | 5.037 |
| 13 | −5.316 | 4.092 | Fused silica | 4.659 |
| 14 | −4.477 | 0.904 | | 4.116 |
| 15 | 2.448 | 1.906 | Fused silica | 2.619 |
| 16 | 4.138 | 0.248 | | 1.101 |
| 17 | Infinity | 1.501 | | 0.801 |
| 18 | 16.697 | 2.750 | Fused silica | 25.240 |
| 19 | 13.901 | 7.871 | | 22.000 |
| 20 | −78.318 | 2.000 | Fused silica | 22.000 |
| 21 | −100.000 | −2.000 | MIRROR | 22.000 |
| 22 | −78.318 | −7.871 | | 22.000 |
| 23 | 13.901 | −2.750 | Fused silica | 22.000 |
| 24 | 16.697 | 2.750 | MIRROR | 25.240 |
| 25 | 13.901 | 7.871 | | 22.000 |
| 26 | −78.318 | 2.000 | Fused silica | 21.000 |
| 27 | −100.000 | 0.200 | | 22.000 |
| IMA | Infinity | | | 0.291 |

Figure 9:
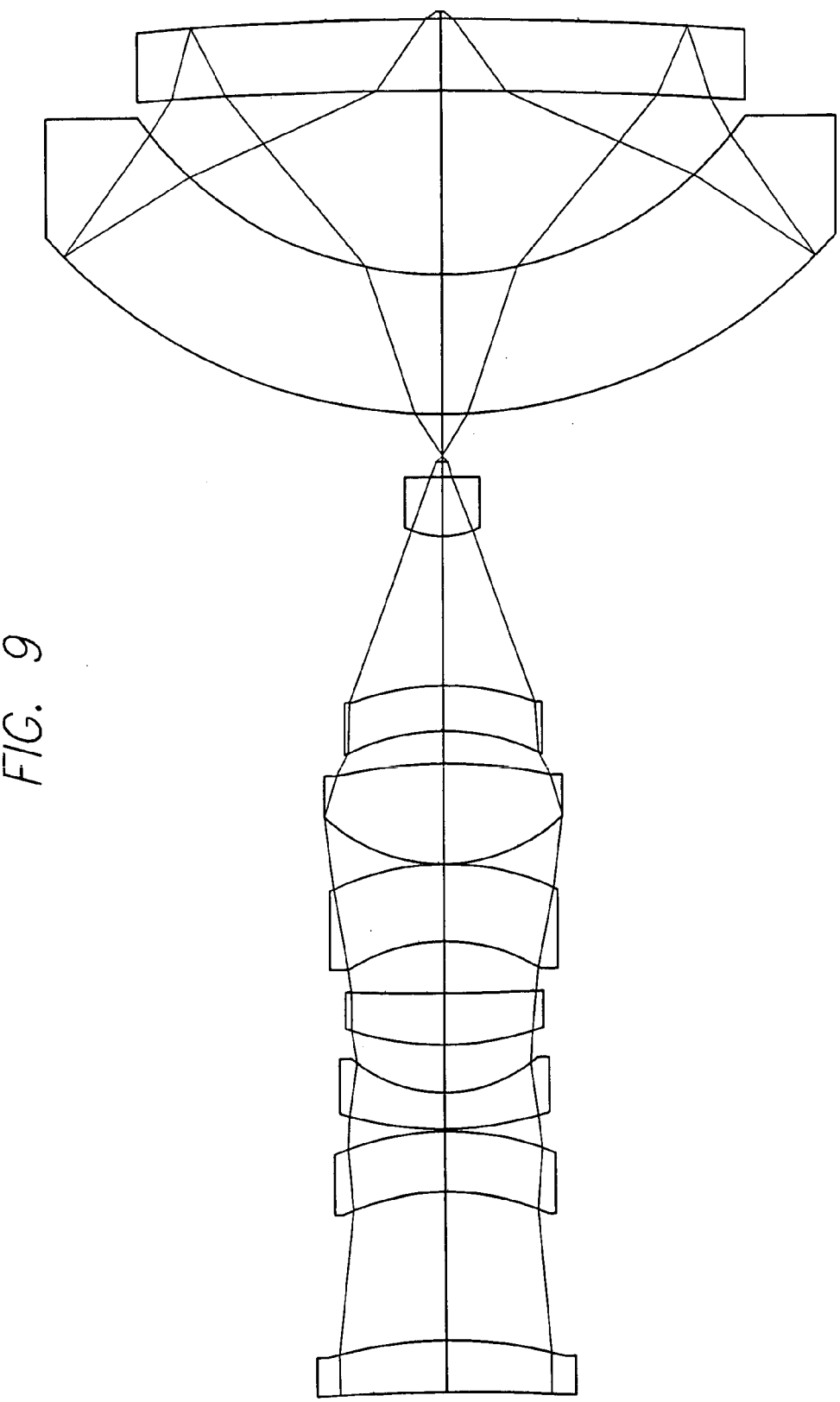
FIG. 9 is an approximately 0.28 mm field design having approximately 26 mm diameter, a wavelength of between approximately 297 and 313 nm, and NA of approximately 0.90.

FIG. 9 is an approximately 0.28 mm field design having approximately 26 mm diameter, a wavelength of between approximately 297 and 313 nm, and NA of approximately 0.90. The lens prescription for this design is shown in Table 7.

TABLE 7

Prescription for lenses for the design of FIG. 9

| Surf | Radius | Thickness | Glass | Diameter |
|---|---|---|---|---|
| OBJ | Infinity | Infinity | | 0.000 |
| 1 | Infinity | 20.163 | | 8.585 |
| STO | Infinity | −20.163 | | 7.170 |
| 3 | −115.896 | 1.750 | Fused silica | 8.591 |
| 4 | −16.723 | 5.036 | | 8.562 |
| 5 | −8.430 | 2.000 | Fused silica | 7.122 |
| 6 | −9.664 | 0.100 | | 7.349 |
| 7 | 11.608 | 1.200 | Fused silica | 7.019 |
| 8 | 4.779 | 1.598 | | 6.337 |

TABLE 7-continued

Prescription for lenses for the design of FIG. 9

| Surf | Radius | Thickness | Glass | Diameter |
|---|---|---|---|---|
| 9 | 10.332 | 1.750 | Fused silica | 6.622 |
| 10 | 135.162 | 1.719 | | 6.592 |
| 11 | −6.281 | 2.555 | Fused silica | 6.583 |
| 12 | −9.052 | 0.100 | | 7.587 |
| 13 | 5.854 | 3.250 | Fused silica | 7.900 |
| 14 | −17.400 | 1.125 | | 7.264 |
| 15 | −7.026 | 1.499 | Fused silica | 6.559 |
| 16 | −8.971 | 5.055 | | 6.242 |
| 17 | 2.951 | 1.906 | Fused silica | 2.442 |
| 18 | −21.084 | 0.500 | | 1.255 |
| 19 | Infinity | 1.580 | | 0.314 |
| 20 | 17.135 | 4.713 | Fused silica | 26.000 |
| 21 | 12.147 | 6.064 | | 20.000 |
| 22 | −164.287 | 2.500 | Fused silica | 20.000 |
| 23 | −100.000 | −2.500 | MIRROR | 20.000 |
| 24 | −164.287 | −6.064 | | 20.000 |
| 25 | 12.147 | −4.713 | Fused silica | 20.000 |
| 26 | 17.135 | 4.713 | MIRROR | 26.000 |
| 27 | 12.147 | 6.064 | | 20.000 |
| 28 | −164.287 | 2.500 | Fused silica | 20.000 |
| 29 | −100.000 | 0.200 | | 20.000 |
| IMA | Infinity | | | 0.280 |

Figure 10:
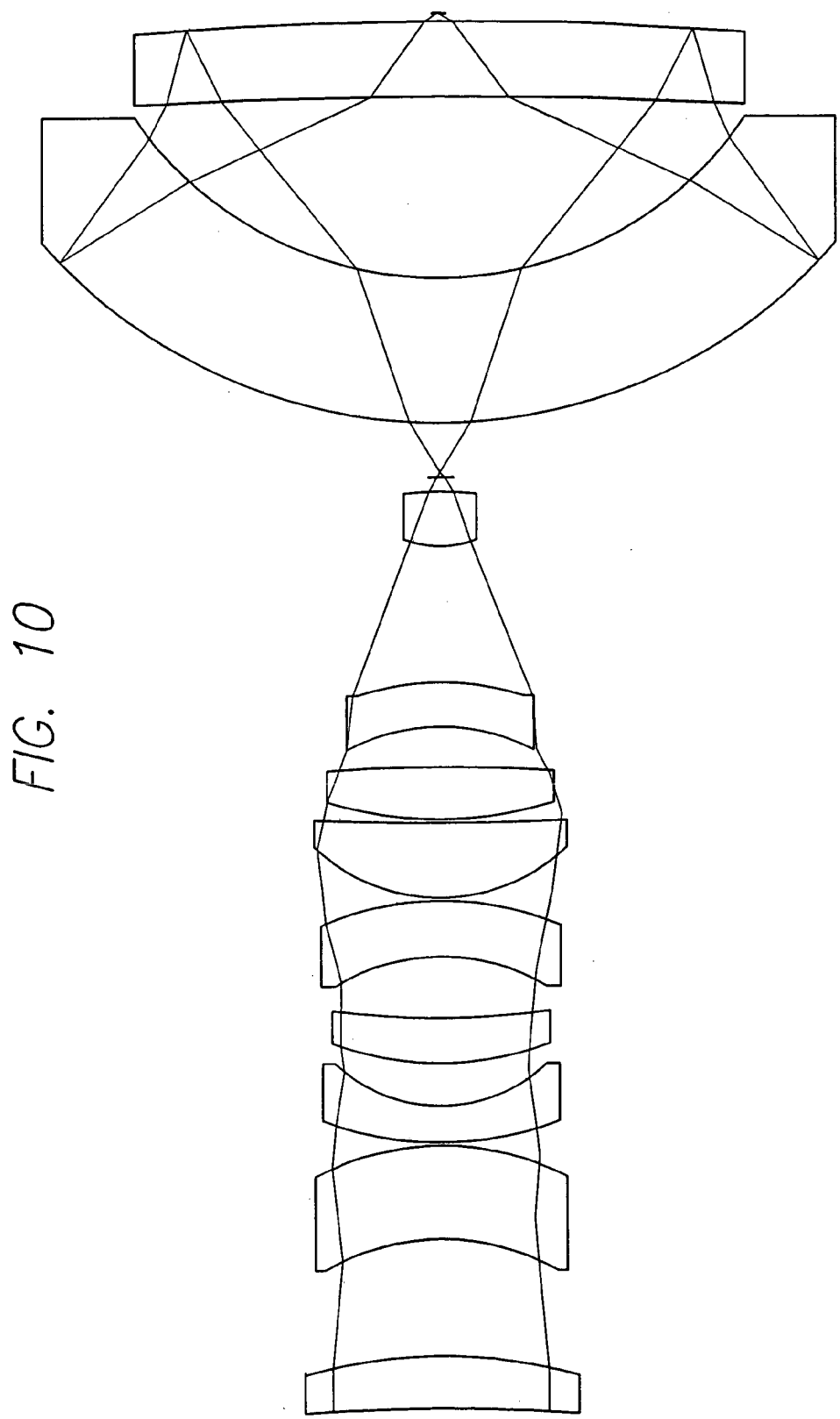
FIG. 10 is an approximately 0.4 mm field design having approximately 26 mm diameter, a wavelength of between approximately 297 and 313 nm, and NA of approximately 0.90.

FIG. 10 is an approximately 0.4 mm field design having approximately 26 mm diameter, a wavelength of between approximately 297 and 313 nm, and NA of approximately 0.90. The lens prescription for this design is shown in Table 8.

TABLE 8

Prescription for lenses for the design of FIG. 10

| Surf | Radius | Thickness | Glass | Diameter |
|---|---|---|---|---|
| OBJ | Infinity | Infinity | | 0.000 |
| 1.000 | Infinity | 17.977 | | 8.974 |
| STO | Infinity | −17.977 | | 7.171 |
| 3.000 | −73.415 | 1.750 | Fused silica | 8.988 |
| 4.000 | −16.484 | 3.889 | | 8.954 |
| 5.000 | −7.914 | 3.077 | Fused silica | 7.822 |
| 6.000 | −8.792 | 0.103 | | 8.317 |
| 7.000 | 10.984 | 1.200 | Fused silica | 7.777 |
| 8.000 | 4.966 | 1.460 | | 6.942 |
| 9.000 | 9.494 | 1.500 | Fused silica | 7.137 |
| 10.000 | 23.256 | 2.020 | | 7.037 |
| 11.000 | −6.669 | 1.871 | Fused silica | 7.044 |
| 12.000 | −10.034 | 0.100 | | 7.866 |
| 13.000 | 6.034 | 2.500 | Fused silica | 8.344 |
| 14.000 | 66.970 | 0.100 | | 7.904 |
| 15.000 | 12.304 | 1.750 | Fused silica | 7.531 |
| 16.000 | −60.162 | 1.300 | | 6.846 |
| 17.000 | −6.852 | 1.499 | Fused silica | 6.139 |
| 18.000 | −8.993 | 4.511 | | 5.804 |
| 19.000 | 3.141 | 1.750 | Fused silica | 2.466 |
| 20.000 | −15.561 | 0.499 | | 1.420 |
| 21.000 | Infinity | 1.841 | | 0.794 |
| 22.000 | 17.138 | 4.708 | Fused silica | 26.000 |
| 23.000 | 12.005 | 6.070 | | 20.000 |
| 24.000 | −177.009 | 2.500 | Fused silica | 20.000 |
| 25.000 | −100.000 | −2.500 | MIRROR | 20.000 |
| 26.000 | −177.009 | −6.070 | | 20.000 |
| 27.000 | 12.005 | −4.708 | Fused silica | 20.000 |
| 28.000 | 17.138 | 4.708 | MIRROR | 26.000 |
| 29.000 | 12.005 | 6.070 | | 20.000 |
| 30.000 | −177.009 | 2.500 | Fused silica | 20.000 |
| 31.000 | −100.000 | 0.200 | | 20.000 |
| IMA | Infinity | | | 0.401 |

Figure 11:
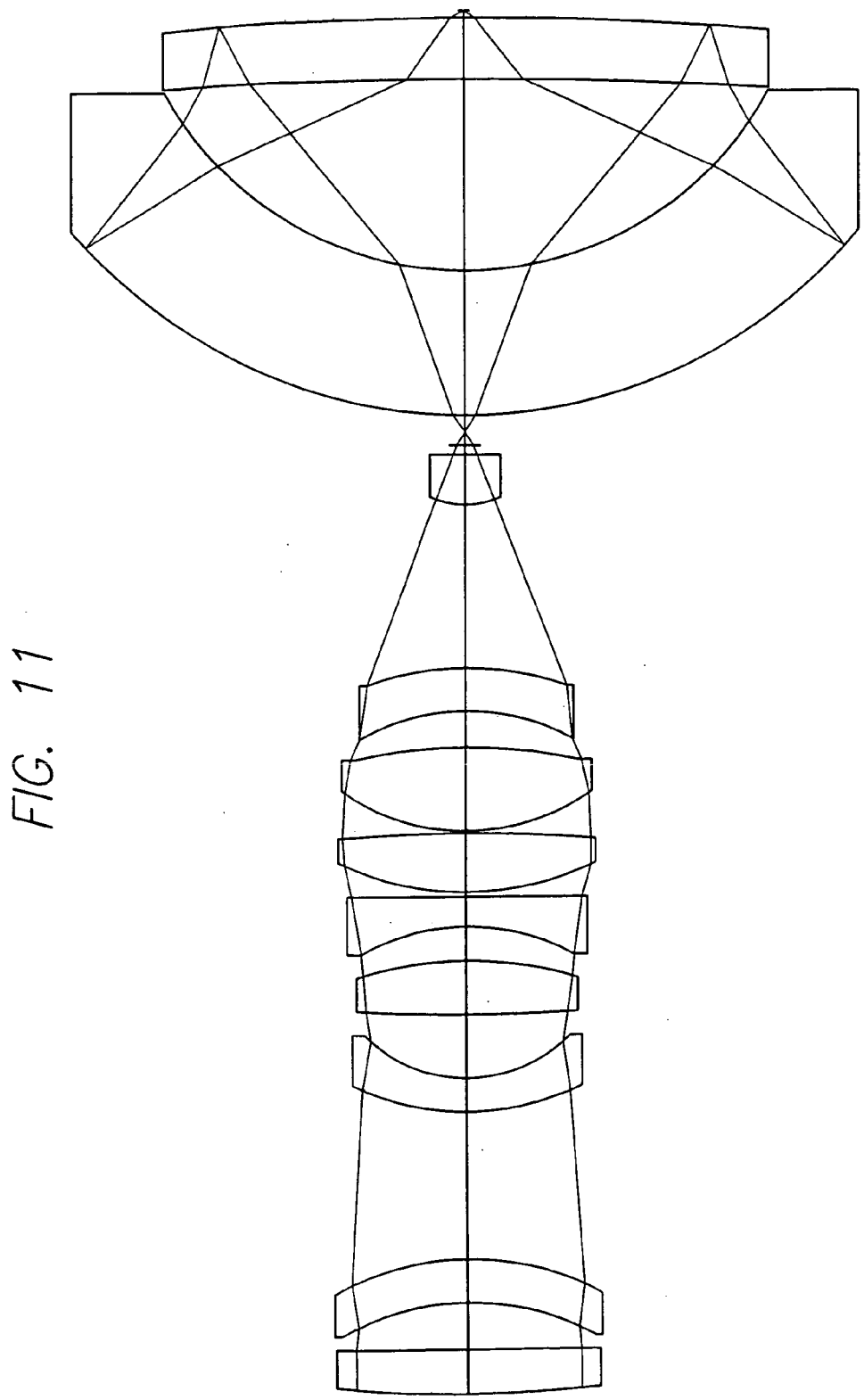
FIG. 11 illustrates a broad band design having approximately 26 mm diameter, a wavelength of between approximately 266 and 313 nm, field size of approximately 0.28 mm, and NA of approximately 0.90.

FIG. 11 illustrates a broad band design having approximately 26 mm diameter, a wavelength of between approximately 266 and 313 nm, field size of approximately 0.28 mm, and NA of approximately 0.90. The lens prescription for this design is shown in Table 9.

TABLE 9

Prescription for lenses for the design of FIG. 11

| Surf | Radius | Thickness | Glass | Diameter |
|---|---|---|---|---|
| OBJ | Infinity | Infinity | | 0.000 |
| 1.000 | Infinity | 19.109 | | 8.783 |
| STO | Infinity | −19.109 | | 7.500 |
| 3.000 | 59.725 | 1.500 | F_SILICA | 8.772 |
| 4.000 | −337.579 | 1.500 | | 8.650 |
| 5.000 | −9.464 | 1.500 | F_SILICA | 8.574 |
| 6.000 | −9.415 | 4.925 | | 8.900 |
| 7.000 | 8.637 | 1.200 | F_SILICA | 7.651 |
| 8.000 | 4.897 | 2.128 | | 6.903 |
| 9.000 | 214.349 | 1.750 | F_SILICA | 7.117 |
| 10.000 | −12.598 | 1.147 | | 7.334 |
| 11.000 | −7.560 | 1.000 | F_SILICA | 7.320 |
| 12.000 | −772.023 | 0.100 | | 7.974 |
| 13.000 | 9.411 | 2.000 | F_SILICA | 8.548 |
| 14.000 | −56.012 | 0.099 | | 8.529 |
| 15.000 | 7.107 | 2.750 | F_SILICA | 8.352 |
| 16.000 | −22.495 | 1.159 | | 7.805 |
| 17.000 | −7.960 | 1.499 | F_SILICA | 7.103 |
| 18.000 | −10.073 | 5.482 | | 6.716 |
| 19.000 | 3.034 | 1.748 | F_SILICA | 2.380 |
| 20.000 | −20.121 | 0.245 | | 1.276 |
| 21.000 | Infinity | 1.041 | | 0.955 |
| 22.000 | 16.855 | 4.806 | F_SILICA | 26.000 |
| 23.000 | 11.392 | 6.422 | | 20.000 |
| 24.000 | −133.502 | 2.000 | F_SILICA | 20.000 |
| 25.000 | −100.000 | −2.000 | MIRROR | 20.000 |
| 26.000 | −133.502 | −6.422 | | 20.000 |
| 27.000 | 11.392 | −4.806 | F_SILICA | 20.000 |
| 28.000 | 16.855 | 4.806 | MIRROR | 26.000 |
| 29.000 | 11.392 | 6.422 | | 20.000 |
| 30.000 | −133.502 | 2.000 | F_SILICA | 20.000 |
| 31.000 | −100.000 | 0.200 | | 20.000 |
| IMA | Infinity | | | 0.283 |

The current invention is capable of similar or better performance over previously known catadioptric objectives with smaller maximum lens diameters. The lens having the largest diameter in these designs is typically the highly curved Mangin mirror element, the second optical element from the object or specimen.

Figure 1:
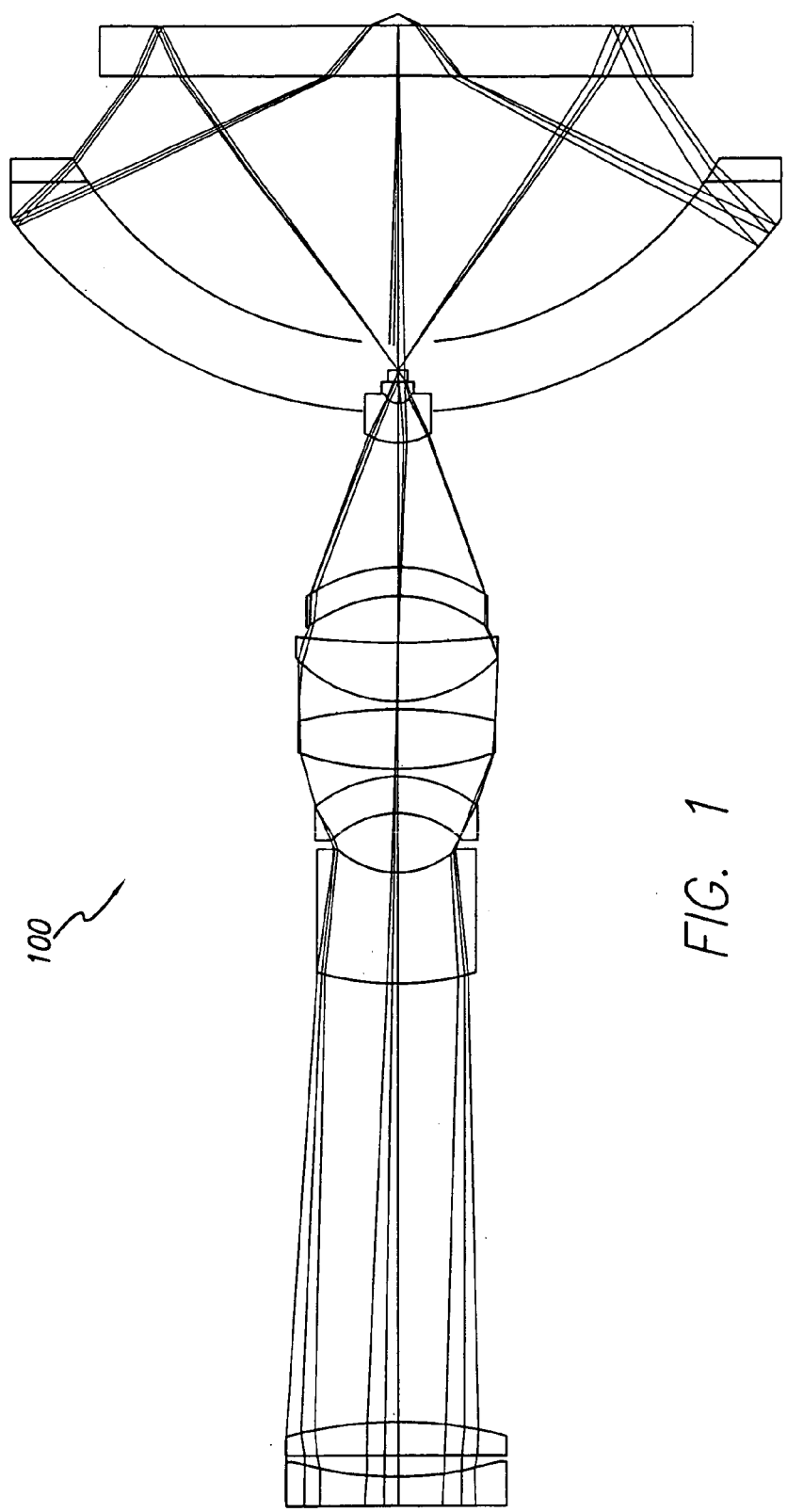
FIG. 1 illustrates an aspect of the catadioptric objective design similar to that presented in FIG. 1 of U.S. Pat. No. 5,717,518.
Figure 2:
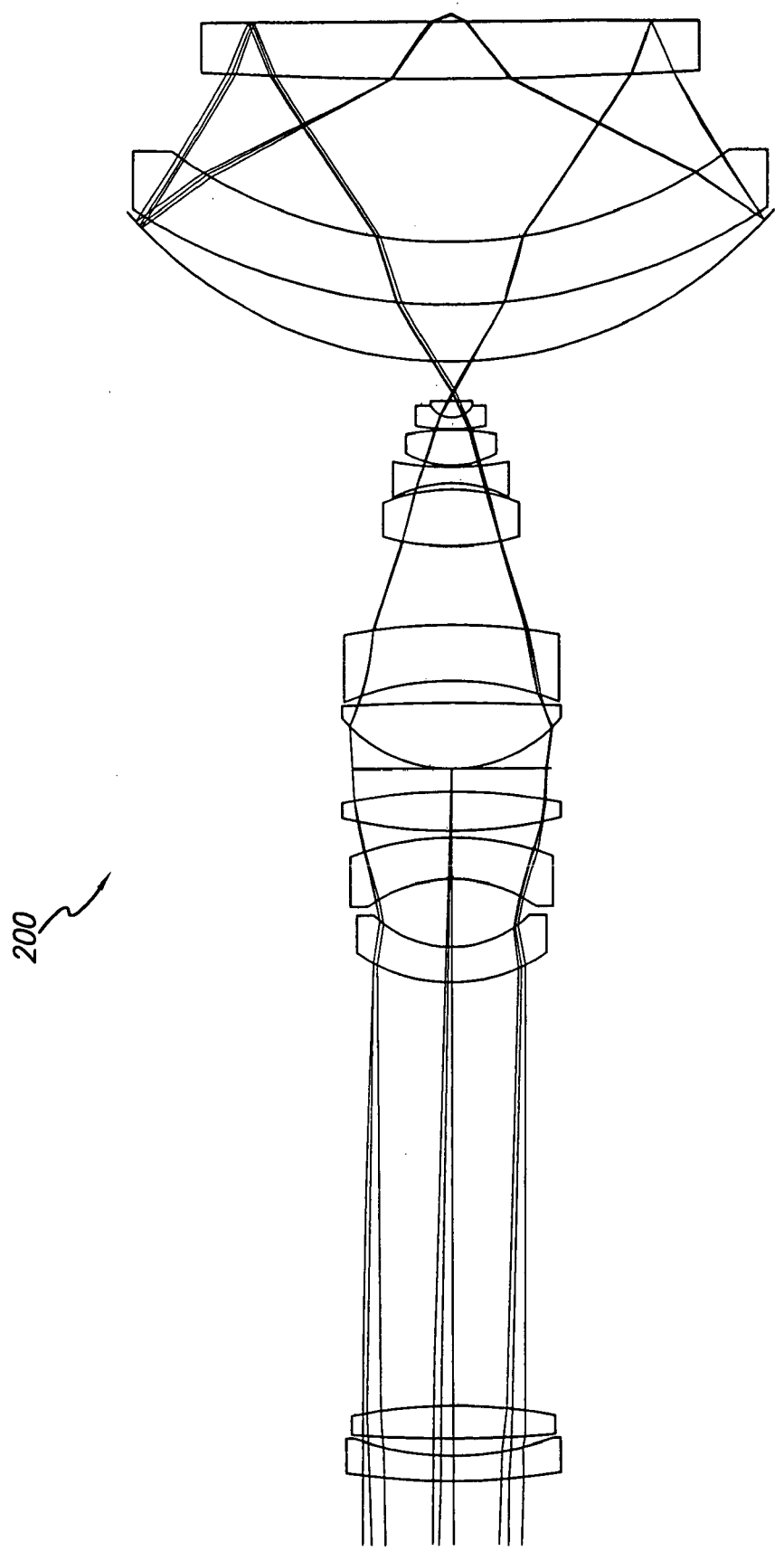
FIG. 2 is an aspect of the catadioptric objective design similar to that presented in FIG. 4 of U.S. Pat. No. 6,483,638.
Figure 12:
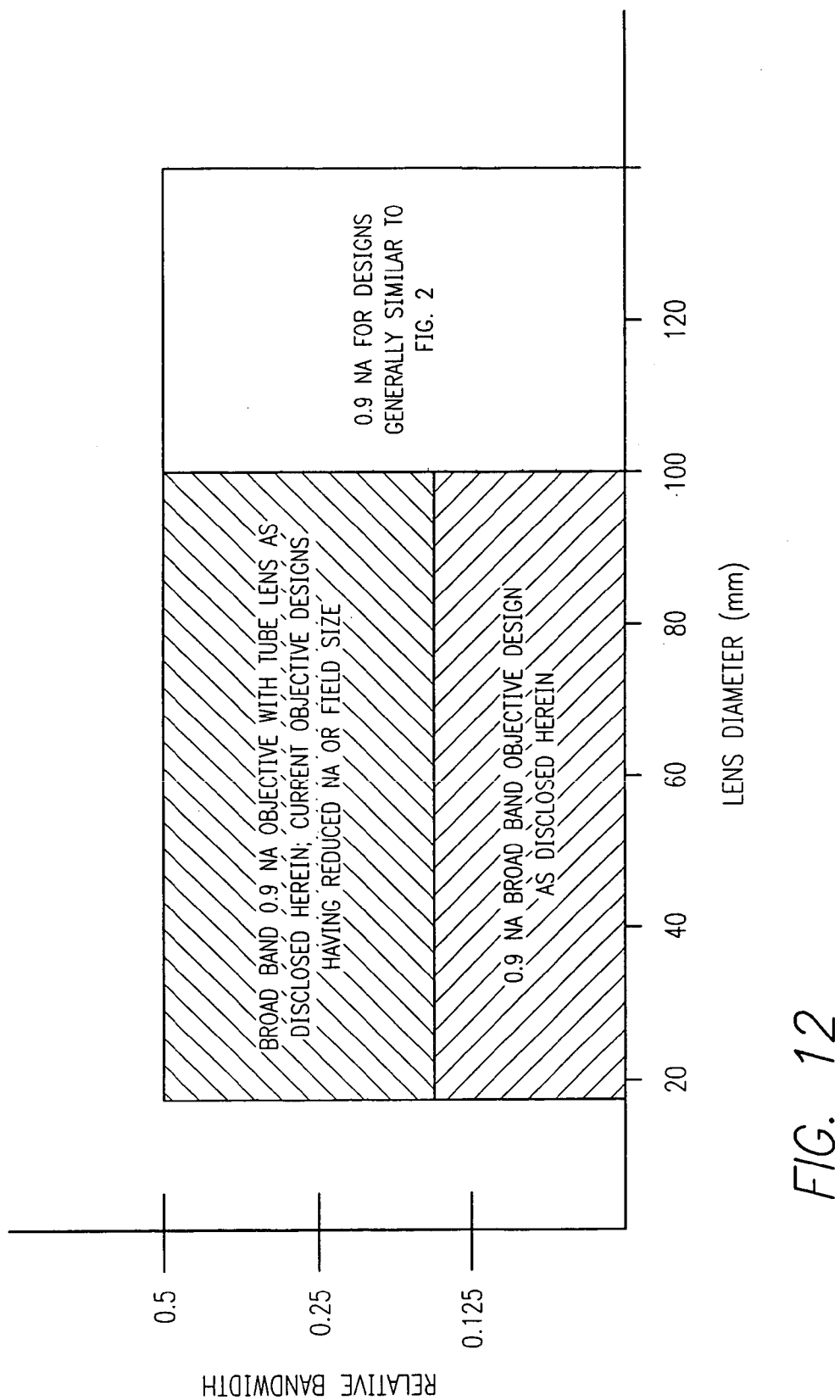
FIG. 12 is a graph comparing relative bandwidth versus the maximum lens element diameter of certain designs, including the current design.

Designs similar to the objective shown in FIG. 2 have 0.9 NA, large corrected bandwidths using large optical elements, and relatively tight manufacturing tolerances. The current designs presented above display large corrected bandwidths but use relatively small optical elements, and the designs have loose manufacturing tolerances. FIG. 12 is a graph contrasting previous systems against the current design in terms of relative bandwidth and maximum lens diameter. Relative bandwidth is defined as the bandwidth of the objective divided by the center wavelength. Previous systems are well corrected for relative bandwidths of at least 0.5 using lenses with maximum diameters greater than 100 mm. Current objective designs as presented herein use a single glass material and are self corrected up to approximately 0.16 using lenses with maximum diameters from around 20 mm up to 100 mm. Further correction of these objectives over relative bandwidths up to 0.5 are possible using tube lenses to correct residual chromatic aberrations as in the designs of FIGS. 7A and 7B. Similar correction is also possible for the objective alone by restricting NA or field size requirements.

Figure 13:
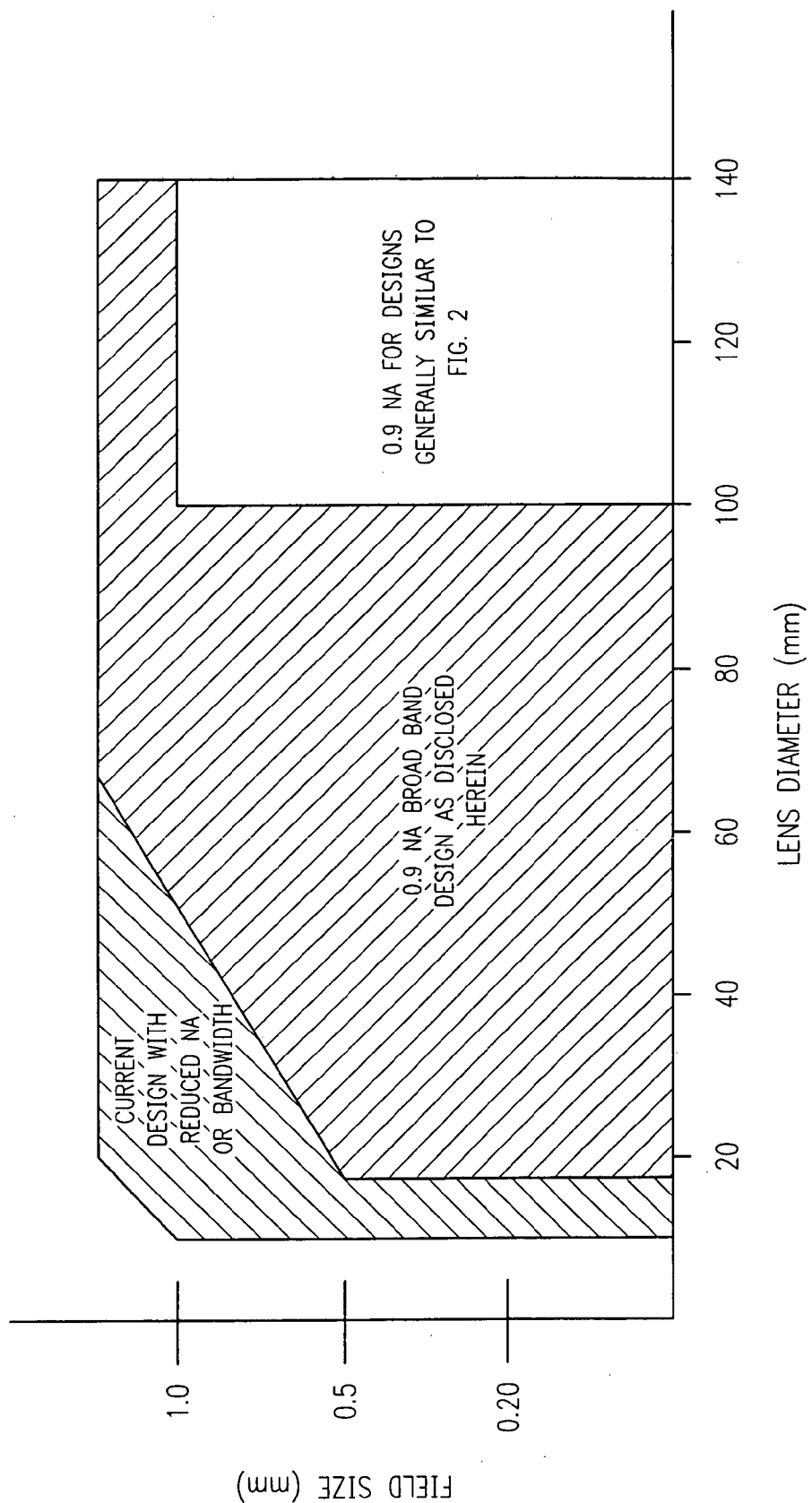
FIG. 13 is a graph comparing field size versus the maximum lens element diameter of certain designs, including the present design.

FIG. 13 is a graph contrasting previous designs and the present design in terms of field size and maximum lens diameter. Previous systems tend to be well corrected for field sizes of 1 mm using lenses with maximum diameters greater than 100 mm. Current objectives using the designs presented herein are corrected for field sizes of 0.4 mm using lenses with maximum diameters from around 25 mm, and 1.0 mm field sizes using lens diameters of 58 mm. From this and the graph of FIG. 12, the ratio between field size and diameter of the largest element (including the Mangin mirror arrangement, field lens(es), and focusing lens(es), is generally less than 100 to 1, and may be less than 60 to 1. For example, the 58 mm lens diameter versus the 1.0 mm field size produces a ratio of 58 to 1. Larger field sizes are also possible with increasing lens diameter. Further correction of these objectives over larger field sizes are possible using tube lenses to correct residual chromatic aberrations as in the designs of FIGS. 7A and 7B. Similar correction is also possible for the objective alone by restricting NA or bandwidth requirements.

The present design may be employed in various environments, including but not limited to lithography, microscopy, biological inspection, medical research, and the like.

The design presented herein and the specific aspects illustrated are meant not to be limiting, but may include alternate components while still incorporating the teachings and benefits of the invention, namely the small design having a high NA able to be employed in various wavelengths using different illumination modes. While the invention has thus been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. An objective employed for use with light energy having a wavelength in the range of approximately 285 to 320 nanometers, comprising:
    a focusing lens group comprising at least one focusing lens configured to receive said light energy;
    a field lens oriented to receive focused light energy from said focusing lens group and provide intermediate light energy; and
    a Mangin mirror arrangement positioned to receive the intermediate light energy from the field lens and form controlled light energy;
    wherein the objective has a field size, wherein a ratio of lens diameter for a largest element of all focusing lenses, the field lens, and the Mangin mirror arrangement to field size is less than approximately 75 to 1 and a diameter of each lens is less than approximately 25 millimeters.

2. The objective of claim 1, said Mangin mirror arrangement comprising:
    a concave lens/mirror element having substantially curved concave surfaces and second surface reflectivity; and
    a relatively flat lens/mirror element having minimally curved surfaces and second surface reflectivity.

3. The objective of claim 1, configured to have a numerical aperture of approximately 0.9.

4. The objective of claim 1, wherein each lens is constructed of fused silica.

5. The objective of claim 1, wherein said objective has a field size of greater than approximately 0.333 millimeters.

6. The objective of claim 1, wherein said objective has a field size of approximately 0.40 millimeters.

7. The objective of claim 1, wherein all lenses are constructed of a single glass material.

8. The objective of claim 7 where the single glass material is fused silica.

9. The objective of claim 1, said objective used with a microscope having a flange, wherein the flange is located approximately 45 millimeters from a specimen.

10. The objective of claim 1, said objective used with a microscope having a flange, wherein the flange is located approximately 100 millimeters from a specimen.

11. The objective of claim 1, wherein said focusing lens group comprising six focusing lenses.

12. The objective of claim 1, wherein said field lens forms an intermediate image between said field lens and said Mangin mirror arrangement.

13. The objective of claim 1, wherein said objective receives light energy reflected back from a specimen through said Mangin mirror arrangement, said field lens, and said focusing lens group.

14. The objective of claim 1, wherein ratio of lens diameter for the largest element of all focusing lenses, the field lens, and the Mangin mirror arrangement to field size is less than 60 to 1.

15. The objective of claim 1, wherein said objective has a field size of approximately 1 millimeters.

16. The objective of claim 1 where relative bandwidth for the objective is less than approximately 0.15.

17. The objective of claim 1, the objective having a numerical aperture associated therewith, wherein the numerical aperture is reduced to allow for increased field size.

18. The objective of claim 1, the objective having a numerical aperture associated therewith, wherein the numerical aperture is reduced to allow for increased relative bandwidth.

19. The objective of claim 1, wherein maximum optical path error from a 10 micron decenter of any lens is less than approximately 0.12 microns.

20. The objective of claim 1, wherein maximum optical path error from a 10 micron decenter of each lens is employed to form an average, and the average is less than approximately 0.08 microns.

21. An objective constructed of a single glass material for use with light energy having a wavelength in the range of approximately 157 nanometers through the infrared light range, comprising:
    at least one focusing lens having diameter less than approximately 100 millimeters receiving said light energy and transmitting focused light energy;
    at least one field lens having diameter less than approximately 100 millimeters, receiving said focused light energy and transmitting intermediate light energy; and
    at least one Mangin mirror element having diameter less than 100 millimeters receiving said intermediate light energy and providing controlled light energy to a specimen;
    wherein said objective yields a field size, wherein a ratio of diameter for a largest element among all focusing lenses, field lenses, and Mangin mirror elements to field size is less than approximately 75 to 1.

22. The objective of claim 21, said at least one Mangin mirror element comprising:
    a concave lens/mirror element having substantially curved concave surfaces and second surface reflectivity; and
    a relatively flat lens/mirror element having minimally curved surfaces and second surface reflectivity.

23. The objective of claim 21, wherein the ratio of diameter for a largest element of all focusing lenses, each field lens, and the Mangin mirror element to field size is less than 60 to 1.

24. The objective of claim 21, configured to have a numerical aperture of approximately 0.9.

25. The objective of claim 21, wherein each lens has a diameter of less than approximately 25 millimeters.

26. The objective of claim 21, wherein said objective has a field size of approximately 0.28 millimeters.

27. The objective of claim 21, wherein said objective has a field size of approximately 0.40 millimeters.

28. The objective of claim 21, said objective used with a microscope having a flange, wherein the flange is located proximate the specimen.

29. The objective of claim 21, said objective used with a microscope having a flange, wherein the flange is located in a range between approximately 45 and approximately 100 millimeters from the specimen.

30. The objective of claim 21, wherein said objective has a field size of approximately 1 millimeters.

31. The objective of claim 21, the objective having a numerical aperture associated therewith, wherein the numerical aperture is reduced to allow for an increase in field size.

32. The objective of claim 21, the objective having a numerical aperture associated therewith, wherein the numerical aperture is reduced to allow for increased relative bandwidth.

33. The objective of claim 21 wherein maximum optical path error from a 10 micron decenter of any lens is less than approximately 0.12 microns.

34. The objective of claim 21 wherein maximum optical path error from a 10 micron decenter of each lens is employed to form an average and the average is less than approximately 0.08 microns.

35. A system for imaging a specimen using light energy in the range of 157 nanometers through the infrared light range, comprising:
a plurality of lenses having diameter of less than approximately 25 millimeters receiving the light energy and providing intermediate light energy; and
a Mangin mirror arrangement receiving the intermediate light energy and providing controlled light energy to the specimen;
wherein said system has a field size, wherein a ratio of diameter for the largest element of all lenses and the Mangin mirror arrangement to field size is less than 75 to 1.

36. The system of claim 35, wherein said plurality of lenses comprise:
a focusing lens group comprising a plurality of focusing lenses, said focusing lens group receiving said light energy and providing focused light energy; and
a field lens group comprising at least one field lens, said field lens group receiving the focused light energy and providing the intermediate light energy.

37. The system of claim 36, wherein ratio of lens diameter for a largest element of all focusing lenses, each field lens, and the Mangin mirror arrangement to field size is less than 60 to 1.

38. The objective of claim 36 where corrected relative bandwidth for the objective is less than approximately 0.15.

39. The system of claim 35, said Mangin mirror arrangement comprising:
a concave lens/mirror element having substantially curved concave surfaces and second surface reflectivity; and
a relatively flat lens/mirror element having minimally curved surfaces and second surface reflectivity.

40. The system of claim 35, configured to have a numerical aperture of approximately 0.9.

41. The system of claim 35, wherein said system has a field size of greater than approximately 0.333 millimeters.

42. The system of claim 35, wherein said system has a field size of approximately 0.40 millimeters.

43. The system of claim 35, said system used with a microscope having a flange, wherein the flange is located proximate the specimen.

44. The system of claim 35, said system used with a microscope having a flange, wherein the flange is located in a range between approximately 45 and approximately 100 millimeters from the specimen.

45. The system of claim 35, wherein said objective has a field size of approximately 1 millimeters.

46. The system of claim 35 where corrected relative bandwidth for the objective is less than approximately 0.15.

47. The system of claim 35 wherein maximum optical path error from a 10 micron decenter of any lens is less than approximately 0.12 microns.

48. The system of claim 35 wherein maximum optical path error from a 10 micron decenter of each lens is employed to form an average and the average is less than approximately 0.08 microns.

49. A catadioptric objective comprising:
a catadioptric group comprising at least one element configured to receive light energy from a specimen and providing reflected light energy forming reflected light energy;
a field lens group comprising at least one field lens receiving the reflected light energy and transmitting resultant light energy; and
a focusing lens group comprising at least one focusing lens receiving resultant light energy and transmitting focused resultant light energy, each field lens and focusing lens having a diameter less than approximately 25 millimeters, said catadioptric objective exhibiting a field size, wherein a ratio of diameter for a largest element among all focusing lenses, all field lenses, and all catadioptric elements to field size is less than 75 to 1.

50. The objective of claim 49, wherein each lens is formed of fused silica.

51. The objective of claim 49, wherein at least one lens is formed of calcium fluoride.

52. The objective of claim 49, wherein lenses are formed from one from a group comprising fused silica and calcium fluoride.

53. The objective of claim 49, where the catadioptric group has less than 20 waves of on axis spherical aberration.

54. The objective of claim 53, wherein a decenter of any element by 0.01 mm reduces an associated wavefront by no more than 0.35 rms waves at a worst field point.

55. The objective of claim 49, wherein a corrected bandwidth of the objective is at least 10 nm.

56. The objective of claim 49, wherein a corrected bandwidth of the objective is at least 50 nm.

57. The objective of claim 49, wherein a corrected bandwidth of the objective includes 313 nm.

58. The objective of claim 49, wherein a corrected bandwidth of the objective includes 266 nm.

59. The objective of claim 49, the objective having a field, wherein a wavefront error is less than 0.1 waves RMS over the field.

60. The objective of claim 49, the objective having a field, wherein the field is greater than approximately 0.333 mm in diameter.

61. The objective of claim 49, the objective having a field, wherein the field is approximately 0.4 mm in diameter.

62. The objective of claim 49, wherein said objective has a field size of approximately 1 millimeters.

63. The objective of claim 49 wherein maximum optical path error from a 10 micron decenter of any lens is less than approximately 0.12 microns.

64. The objective of claim 49 wherein maximum optical path error from a 10 micron decenter of each lens is employed to form an average and the average is less than approximately 0.08 microns.

65. A method of imaging a specimen, comprising:
focusing received light energy using a focusing lens group;
receiving focused light energy and providing intermediate light energy using a field lens group; and
receiving intermediate light energy and forming controlled light energy using a Mangin mirror arrangement;
wherein a ratio of lens diameter for a largest element of all lenses in the focusing lens group, all lenses in the field lens group, and all elements in the Mangin mirror arrangement to field size is less than 75 to 1, and wherein the lens diameter for the largest element of all lenses in the focusing lens group and the field lens group is less than approximately 25 millimeters.

66. The method of claim 65, said method being employed in the field of microscopy.

67. The method of claim 65, said method being employed in the field of semiconductor wafer inspection.

68. The method of claim 65, said method being employed in the field of lithography.

69. The method of claim 65, said method being employed in the field of biological inspection.

70. The method of claim 65, said method being employed in the field of medical research.

71. The method of claim 65, wherein the ratio of the largest element in the focusing lens group, field lens group, and Mangin mirror arrangement to field size is less than 60 to 1.

72. The method of claim 65, wherein all lenses are constructed of fused silica.

73. An objective comprising:
focusing means for receiving light energy and providing focused light energy;
field lensing means for receiving focused light energy from said focusing means and providing intermediate light energy; and
mirror means for receiving the intermediate light energy from the field lensing means and forming controlled light energy, wherein a ratio of diameter for a largest element among the focusing means, field lensing means, and mirror means to field size is less than 75 to 1, and further wherein diameter for the largest element among the focusing means, field lensing means, and mirror means is less than approximately 100 millimeters.

* * * * *